United States Patent
Nakano et al.

(10) Patent No.: US 8,217,389 B2
(45) Date of Patent: Jul. 10, 2012

(54) ORGANIC THIN FILM TRANSISTOR DEVICE AND ORGANIC THIN FILM LIGHT-EMITTING TRANSISTOR

(75) Inventors: Yuki Nakano, Chiba (JP); Masatoshi Saito, Chiba (JP); Hiroaki Nakamura, Chiba (JP)

(73) Assignee: Idemitsu Kosan, Co., Ltd., Tokyo (JP)

( * ) Notice: Subject to any disclaimer, the term of this patent is extended or adjusted under 35 U.S.C. 154(b) by 561 days.

(21) Appl. No.: 12/445,146

(22) PCT Filed: Oct. 10, 2007

(86) PCT No.: PCT/JP2007/069729
§ 371 (c)(1),
(2), (4) Date: Apr. 10, 2009

(87) PCT Pub. No.: WO2008/044695
PCT Pub. Date: Apr. 17, 2008

(65) Prior Publication Data
US 2010/0012929 A1     Jan. 21, 2010

(30) Foreign Application Priority Data
Oct. 12, 2006   (JP) .................................. 2006-278643

(51) Int. Cl.
*H01L 35/24* (2006.01)
(52) U.S. Cl. ................... 257/40; 257/E51.001
(58) Field of Classification Search .................. 257/40, 257/E51.001
See application file for complete search history.

(56) References Cited

U.S. PATENT DOCUMENTS

| | | | |
|---|---|---|---|
| 7,288,818 B2* | 10/2007 | Lee et al. | 257/347 |
| 2001/0015438 A1* | 8/2001 | Callegari et al. | 257/40 |
| 2003/0021912 A1 | 1/2003 | Farrand et al. | |
| 2004/0165806 A1 | 8/2004 | Zhou et al. | |
| 2005/0258398 A1* | 11/2005 | Kobayashi et al. | 252/299.61 |
| 2006/0100433 A1* | 5/2006 | Yamaguchi et al. | 546/14 |

FOREIGN PATENT DOCUMENTS

| | | |
|---|---|---|
| EP | 0 716 458 A2 | 6/1996 |
| EP | 0 716 459 A2 | 6/1996 |

(Continued)

OTHER PUBLICATIONS

International Search Report of PCT/JP2007/069729 (Dec. 28, 2007).

(Continued)

*Primary Examiner* — Anthony Ho
(74) *Attorney, Agent, or Firm* — Millen, White, Zelano & Branigan, P.C.

(57) ABSTRACT

An organic thin film transistor including a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound having a specified structure; and an organic thin film light emitting transistor utilizing an organic thin film transistor, wherein the organic thin film transistor is one in which light emission is obtained utilizing a current flowing between the source and the drain, and the light emission is controlled upon application of a voltage to the gate electrode, and is made high with respect to the response speed (driving speed) and has a large ON/OFF ratio, are provided.

20 Claims, 5 Drawing Sheets

DEVICE A

FOREIGN PATENT DOCUMENTS

| | | |
|---|---|---|
| EP | 0 786 820 A2 | 7/1997 |
| EP | 0 852 403 A1 | 7/1998 |
| EP | 0 921 579 A2 | 6/1999 |
| JP | 5-55568 A | 3/1993 |
| JP | 8-228034 A | 9/1996 |
| JP | 8-228035 A | 9/1996 |
| JP | 9-232589 A | 9/1997 |
| JP | 10-125924 A | 5/1998 |
| JP | 10-135481 A | 5/1998 |
| JP | 10-190001 A | 7/1998 |
| JP | 11-251601 A | 9/1999 |
| JP | 2000-174277 A | 6/2000 |
| JP | 2003-73382 A | 3/2003 |
| JP | 2004-179249 A | 6/2004 |
| JP | 2005-244236 A | 9/2005 |
| JP | 2007-59682 A | 3/2007 |
| JP | 2007-238866 A | 9/2007 |
| JP | 2007-311608 A | 11/2007 |
| WO | WO-02 35580 | 5/2002 |
| WO | WO-2007 068618 | 6/2007 |

OTHER PUBLICATIONS

F. Ebisawa et al., "Electrical Properties of Polyacetylene/Polysiloxane Interface", J. Appl. Phys., vol. 54, No. 6 (Jun. 1983) pp. 3255-3259.

A. Assadi et al., "Field-Effect Mobility of Poly(3-Hexylthiophene)", Appl. Phys. Lett., vol. 53, No. 3 (Jul. 18, 1988) pp. 195-197.

G. Guillaud et al., "Field-Effect Transistors Based on Intrinsic Molecular Semiconductors", Chemical Physics Letters, vol. 167, No. 6 (Apr. 13, 1990) pp. 503-506.

X. Peng et al., "All-Organic Thin-Film Transistors Made of Alpha-Sexithienyl Semiconducting and Various Polymeric Insulating Layers", Appl. Phys. Lett., vol. 57, No. 19 (Nov. 5, 1990) pp. 2013-2015.

G. Horowitz et al., "Thin-Film Transistors Based on Alpha-Conjugated Oligomers", Synthetic Metals, vol. 41-43 (1991) pp. 1127-1130.

S. Miyauchi et al., "Junction Field-Effect Transistor Using Polythiophene as an Active Component", Synthetic Metals, vol. 41-43 (1991) pp. 1155-1158.

H. Fuchigami et al., "Polythienylenevinylene Thin-Film Transistor With High Carrier Mobility", Appl. Phys. Lett., vol. 63, No. 10 (Sep. 6, 1993) pp. 1372-1374.

H. Koezuka et al., "Polythiophene Field-Effect Transistor With Polypyrrole Worked as Source and Drain Electrodes", Appl. Phys. Lett., vol. 62, No. 15 (Apr. 12, 1993) pp. 1794-1796.

F. Garnier et al., "All-Polymer Field-Effect Transistor Realized by Printing Techniques", Science, vol. 265 (Sep. 16, 1994) pp. 1684-1689.

A.R. Brown et al., "A Universal Relation Between Conductivity and Field-Effect Mobility in Doped Amorphous Organic Semiconductors", Synthetic Metals, vol. 68 (1994) pp. 65-70.

A. Dodabalapur et al., "Organic Transistors : Two-Dimensional Transport and Improved Electrical Characteristics", Science, vol. 268 (Apr. 14, 1995) pp. 270-271.

T. Sumimoto et al., "Fabrication and Characterization of Field Effect Transistors of Layered Structure Consisting of TMTSF and TCNQ", Synthetic Metals, vol. 86 (1997) pp. 2259-2260.

K. Kudo et al., "Schottky Gate Static Induction Transistor Using Copper Phthalocyanine Films", Thin Solid Films, vol. 331 (1998) pp. 51-54.

K. Kudo et al., "Organic Static Induction Transistor for Color Sensors", Synthetic Metals, vol. 102 (1999) pp. 900-903.

K. Kudo et al., "Organic Static Induction Transistor for Display Devices", Synthetic Metals, vol. 111-112 (2000) pp. 11-14.

J.H. Schön et al., "Gate-Induced Superconductivity in Oligophenylenevinylene Single Crystals", Adv. Mater., vol. 13, No. 16 (Aug. 16, 2001) pp. 1273-1274.

T.E. Hopkins et al., "Chiral Polyolefins", Adv. Mater., vol. 15, No. 6 (Mar. 17, 2003) p. 478.

W. Geens et al., "Field-Effect Mobilities in Spin-Cast and Vacuum-Deposited PPV-Type Pentamers", Synthetic Metals, vol. 122 (2001) pp. 191-194.

L.L. Chua et al., "General Observation of N-Type Field-Effect Behaviour in Organic Semiconductors", Nature, vol. 434 (Mar. 10, 2005) pp. 194-199.

C.D. Dimitrakopoulos et al., "Organic Thin-Film Transistors : A Review of Recent Advances", IBM J. Res. & Dev., vol. 45, No. 1 (Jan. 2001) pp. 11-27.

Chu, C. et al., "High-performance organic thin-film transistors with metal oxide/metal bilayer electrode," Applied Physics Letters, 2005, vol. 87.

Muccini, M. et al., "A bright future for organic field-effect transistors," Nature Materials, Aug. 2006, vol. 5, pp. 605-613.

Roy, V. A. L. et al., "Functionalized arylacetylene oligomers for organic thin-film transistors (OTFTs)," Advanced Materials, 2005, vol. 17, pp. 1258-1261.

Schmidt, R. et al., "Highly soluble acenes as semiconductors for thin film transistors," Journal of Materials Chemistry, 2006, vol. 16, pp. 3708-3714.

Supplementary European Search Report for EP 07 82 9467 dated May 6, 2011.

* cited by examiner

DEVICE A

DEVICE B

DEVICE C

DEVICE D

ORGANIC THIN FILM TRANSISTOR DEVICE AND ORGANIC THIN FILM LIGHT-EMITTING TRANSISTOR

TECHNICAL FIELD

The present invention relates to an organic thin film transistor and an organic thin film light emitting transistor and in particular, to an organic thin film transistor containing a compound with high mobility and capable of undergoing a high-speed operation and an organic thin film light emitting transistor using the same as a light emitting device.

BACKGROUND ART

A thin film transistor (TFT) is broadly used as a switching element for display of a liquid crystal display, etc. A cross-sectional structure of a representative TFT is shown in FIG. 3. As shown in FIG. 3, TFT has a gate electrode, an insulator layer and an organic semiconductor layer in this order on a substrate and has a source electrode and a drain electrode formed at a prescribed interval on the organic semiconductor layer. The organic semiconductor layer forms a channel region and when a current flowing between the source electrode and the drain electrode is controlled by a voltage to be applied to the gate electrode, undergoes an ON/OFF operation.

Hitherto, this TFT has been prepared using amorphous or polycrystalline silicon. However, there was a problem that a CVD apparatus which is used for the preparation of TFT using such silicon is very expensive so that increasing in size of a display, etc. using TFT is accompanied by a significant increase of manufacturing costs. Also, since a process for fabricating amorphous or polycrystalline silicon is carried out at a very high temperature, the kind of a material which can be used as a substrate is limited, causing a problem that a light-weight resin substrate or the like cannot be used.

In order to solve such a problem, TFT using an organic material in place of amorphous or polycrystalline silicon is proposed. With respect to the fabrication method to be employed for forming TFT using an organic material, there are known a vacuum vapor deposition method, a coating method and so on. According to such a fabrication method, it is possible to realize increasing in size of a device while suppressing an increase of the manufacturing costs, and the process temperature which is necessary at the time of fabrication can be made relatively low. For that reason, in TFT using an organic material, there is an advantage that limitations at the time of selection of a material to be used for the substrate are few, and its realization is expected. TFT using an organic material has been eagerly reported, and, for example, Non-Patent Documents 1 to 20 can be enumerated.

Also, as the organic material to be used in an organic compound layer of TFT, so far as a p-type is concerned, multimers such as conjugated polymers, thiophenes, etc. (Patent Documents 1 to 5, etc.); metallophthalocyanine compounds (Patent Document 6, etc.); condensed aromatic hydrocarbons such as pentacene, etc. (Patent Document 7 and 8, etc.); and the like are used singly or in a state of a mixture with other compounds. Also, so far as a material of an n-type FET is concerned, for example, Patent Document 9 discloses 1,4,5,8-naphthalenetetracarboxyl dianhydride (NTCDA), 11,11,12,12-tetracyanonaphth-2,6-quinodimethane (TCN-NQD), 1,4,5,8-naphthalenetetracarboxyl diimide (NTCDI), etc; and Patent Document 10 discloses phthalocyanine fluoride.

Furthermore, Patent Document 11 describes an invention regarding an organic semiconductor material including at least one structure in which aromatic hydrocarbon ring-containing or aromatic heterocyclic ring-containing groups are bonded to each other via an alkynylene group and having a molecular of not more than 2,000 and an organic electronic device using the same, enumerates compounds having a thiophene ring as a preferred structure and merely exhibits device properties regarding the compounds having a thiophene ring as the working examples. Also, Patent Document 12 describes an invention of thienothiophene derivatives, discloses compounds in which the thienothiophene derivative is bonded to benzene via acetylene and describes the utilization for a thin film transistor; however, it does not describe working examples thereof.

On the other hand, there is an organic electroluminescence (EL) device as a device similarly using electric conduction. However, the organic EL device generally forcedly feeds charges upon application of a strong electric field of $10^5$ V/cm or more in the thickness direction of a ultra-thin film of not more than 100 nm; whereas in the case of the organic TFT, it is necessary to feed charges at a high speed over a distance of several μm or more in an electric field of not more than $10^5$ V/cm, and accordingly, the organic material itself is required to become more conductive. However, the foregoing compounds in the conventional organic TFTs involved a problem in high-speed response as a transistor because the field effect mobility is low, and the response speed is slow. Also, the ON/OFF ratio was small. The terms "ON/OFF ratio" as referred to herein refer to a value obtained by dividing a current flowing between a source and a drain when a gate voltage is applied (ON) by a current flowing between the source and the drain when no gate voltage is applied (OFF). The terms "ON current" as referred to herein usually refer to a current value (saturated current) at the time when the current flowing between the source and the drain is saturated when the gate voltage is increased.

[Patent Document 1] JP-A-8-228034
[Patent Document 2] JP-A-8-228035
[Patent Document 3] JP-A-9-232589
[Patent Document 4] JP-A-10-125924
[Patent Document 5] JP-A-10-190001
[Patent Document 6] JP-A-2000-174277
[Patent Document 7] JP-A-5-55568
[Patent Document 8] JP-A-2001-94107
[Patent Document 9] JP-A-10-135481
[Patent Document 10] JP-A-11-251601
[Patent Document 11] JP-A-2004-179249
[Patent Document 12] JP-A-2003-73382
[Non-Patent Document 1] F. Ebisawa, et al., *Journal of Applied Physics*, Vol. 54, page 3255, 1983
[Non-Patent Document 2] A. Assadi, et al., *Applied Physics Letter*, Vol. 53, page 195, 1988
[Non-Patent Document 3] G. Guillaud, et al., *Chemical Physics Letter*, Vol. 167, page 503, 1990
[Non-Patent Document 4] X. Peng, et al., *Applied Physics Letter*, Vol. 57, page 2013, 1990
[Non-Patent Document 5] G. Horowitz, et al., *Synthetic Metals*, Vol. 41-43, page 1127, 1991
[Non-Patent Document 6] S. Miyauchi, et al., *Synthetic Metals*, Vol. 41-43, 1991
[Non-Patent Document 7] H. Fuchigami, et al., *Applied Physics Letter*, Vol. 63, page 1372, 1993
[Non-Patent Document 8] H. Koezuka, et al., *Applied Physics Letter*, Vol. 62, page 1794, 1993
[Non-Patent Document 9] F. Garnier, et al., *Science*, Vol. 265, page 1684, 1994

[Non-Patent Document 10] A. R. Brown, et al., *Synthetic Metals*, Vol. 68, page 65, 1994

[Non-Patent Document 11] A. Dodabalapur, et al., *Science*, Vol. 268, page 270, 1995

[Non-Patent Document 12] T. Sumimoto, et al., *Synthetic Metals*, Vol. 86, page 2259, 1997

[Non-Patent Document 13] K. Kudo, et al., *Thin Solid Films*, Vol. 331, page 51, 1998

[Non-Patent Document 14] K. Kudo, et al., *Synthetic Metals*, Vol. 102, page 900, 1999

[Non-Patent Document 15] K. Kudo, et al., *Synthetic Metals*, Vol. 111-112, page 11, 2000

[Non-Patent Document 16] *Advanced Materials*, Vol. 13, No. 16, 2001, page 1273

[Non-Patent Document 17] *Advanced Materials*, Vol. 15, No. 6, 2003, page 478

[Non-Patent Document 18] W. Geens, et al., *Synthetic Metals*, Vol. 122, page 191, 2001

[Non-Patent Document 19] Lay-Lay Chua, et al., *Nature*, Vol. 434, March 10 issue, 2005, page 194

[Non-Patent Document 20] C. D. Dimitrakopoulos, et al., *IBM J. RES & DEV.*, Vol. 45, No. 1, page 11, 2001

DISCLOSURE OF THE INVENTION

Problems that the Invention is to Solve

In order to solve the foregoing problems, the present invention has been made. An object of the present invention is to provide an organic thin film transistor having a high response speed (driving speed) and a large ON/OFF ratio and an organic thin film light emitting transistor using the same. Here, the fact that the response speed (driving speed) is high is verified with a high mobility.

Means for Solving the Problems

In order to achieve the foregoing object, the present inventors made extensive and intensive investigations. As a result, it has been found that the foregoing object is achieved by using a compound with a structure having an aromatic hydrocarbon group or an aromatic heterocyclic group at the center thereof, as represented by the following general formula (1), and having enhanced planarity as a compound in an organic semiconductor layer of an organic thin film transistor, leading to accomplishment of the present invention.

That is, the present invention is to provide an organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound represented by the following general formula (1).

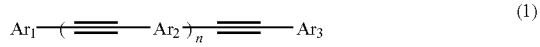

[In the general formula (1), $Ar_1$ is represented by the following general formula (2); and $Ar_3$ is represented by the following general formula (3).

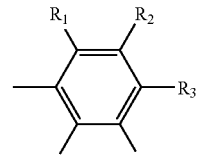

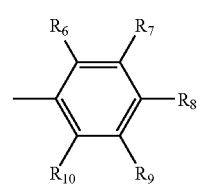

(In the general formulae (2) and (3), $R_1$ to $R_{10}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 3 to 30 carbon atoms or a cyano group; and each of these groups may have a substituent.

$R_1$ to $R_5$ and $R_6$ to $R_{10}$ may each form a saturated or unsaturated cyclic structure together with an adjacent group thereto.

$Ar_2$ represents an optionally substituted aromatic hydrocarbon group having from 6 to 60 carbon atoms or an optionally substituted aromatic heterocyclic group having from 1 to 60 carbon atoms.

n represents an integer of from 1 to 20.]

Also, the present invention is to provide an organic thin film light emitting transistor in which in an organic thin film transistor, light emission is obtained utilizing a current flowing between a source and a drain, and the light emission is controlled upon application of a voltage to a gate electrode.

ADVANTAGES OF THE INVENTION

The organic thin film transistor of the present invention is made high with respect to the response speed (driving speed), has a large ON/OFF ratio and has a high performance as a transistor and therefore, can also be utilized as an organic thin film light emitting transistor which can achieve light emission.

BEST MODES FOR CARRYING OUT THE INVENTION

Figure 1:
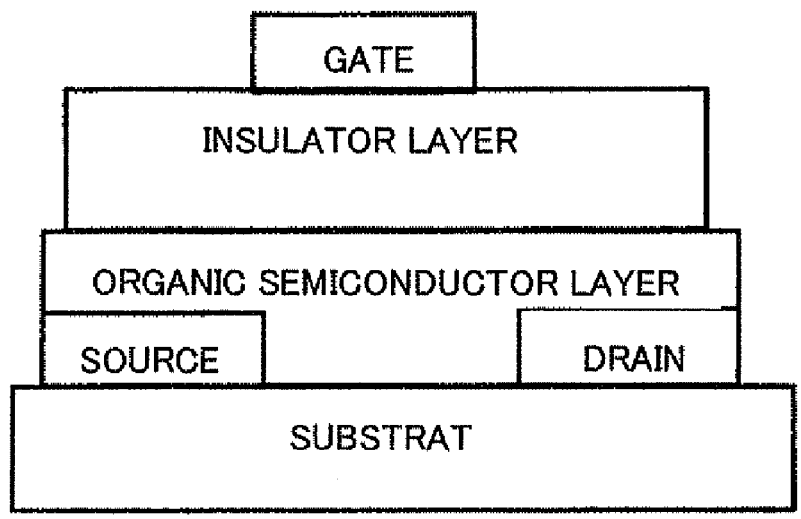
FIG. 1 is a view showing one embodiment of a device configuration of an organic thin film transistor of the present invention.

The organic thin film light emitting transistor of the present invention is concerned with an organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound represented by the following general formula (1).

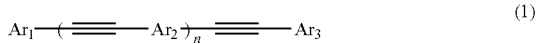

(1)

In the general formula (1), $Ar_1$ is represented by the following general formula (2); and $Ar_3$ is represented by the following general formula (3).

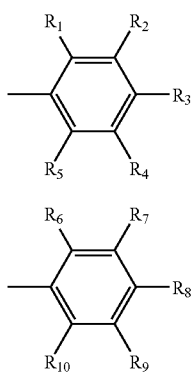

In the general formulae (2) and (3), $R_1$ to $R_{10}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 3 to 30 carbon atoms or a cyano group; and each of these groups may have a substituent.

$R_1$ to $R_5$ and $R_6$ to $R_{10}$ may each form a saturated or unsaturated cyclic structure together with an adjacent group thereto.

Specific examples of each of the groups represented by $R_1$ to $R_{10}$ are hereunder described.

Examples of the halogen atom include fluorine, chlorine, bromine and iodine atoms.

Examples of the alkyl group include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, etc.

Examples of the haloalkyl group include a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, a fluoromethyl group, a 1-fluoromethyl group, a 2-fluoromethyl group, a 2-fluoroisobutyl group, a 1,2-difluoroethyl group, a difluoromethyl group, a trifluoromethyl group, a pentafluoroethyl group, a perfluoroisopropyl group, a perfluorobutyl group, a perfluorocyclohexyl group, etc.

The alkoxyl group is a group represented by $-OX^1$, and examples of $X^1$ are the same as those described for the foregoing alkyl group; and the haloalkoxyl group is a group represented by $-OX^2$, and examples of $X^2$ are the same as those described for the foregoing haloalkyl group.

The alkylthio group is a group represented by $-SX^1$, and examples of $X^1$ are the same as those described for the foregoing alkyl group; and the haloalkylthio group is a group represented by $-SX^2$, and examples of $X^2$ are the same as those described for the foregoing haloalkyl group.

The alkylamino group is a group represented by $-NHX^1$; the dialkylamino group is a group represented by $-NX^1X^3$; and examples of each of $X^1$ and $X^3$ are the same as those described for the foregoing alkyl group. The alkyl groups of the dialkylamino group may be bonded to each other to form a nitrogen atom-containing cyclic structure; and examples of the cyclic structure include pyrrolidine, piperidine, etc.

The alkylsulfonyl group is a group represented by $-SO_2X^1$, and examples of $X^1$ are the same as those described for the foregoing alkyl group; and the haloalkylsulfonyl group is a group represented by $-SO_2X^2$, and examples of $X^2$ are the same as those described for the foregoing haloalkyl group.

Examples of the aromatic hydrocarbon group include a phenyl group, a naphthyl group, an anthryl group, a phenanthryl group, a fluorenyl group, a perylenyl group, a tetracenyl group, a pentacenyl group, etc.

Examples of the aromatic heterocyclic group include a dithienylphenyl group, a benzofuranyl group, a benzothiophenyl group, a quinolinyl group, a carbazolyl group, a dibenzofuranyl group, a dibenzothiophenyl group, a benzothiadiazonyl group, etc.

The alkylsilyl group is a group represented by —SiX$^1$X$^3$X$^4$, and examples of each of X$^1$, X$^3$ and X$^4$ are the same as those described for the foregoing alkyl group.

Examples of the saturated cyclic structure include a cyclobutyl group, a cyclopentyl group, a cyclohexyl group, a 1,4-dioxetanyl group, etc.

Examples of the unsaturated cyclic structure are the same as those described for the foregoing aromatic hydrocarbon group.

In the general formula (1), Ar$_2$ represents an optionally substituted aromatic hydrocarbon group having from 6 to 60 carbon atoms or an optionally substituted aromatic heterocyclic group having from 1 to 60 carbon atoms.

Examples of the aromatic hydrocarbon group having from 6 to 60 carbon atoms include divalent residues of benzene, naphthalene, anthracene, phenanthracene, tetracene, chrysene, pentacene, etc., with divalent residues of benzene, naphthalene, anthracene, phenanthracene, tetracene and pentacene being preferable.

As the aromatic heterocyclic group having from 1 to 60 carbon atoms, a condensed polycyclic aromatic heterocyclic ring having from 6 to 60 carbon atoms (preferably having from 8 to 60 carbon atoms) is preferable (the condensed polycyclic aromatic heterocyclic group is preferably a structure including a benzene ring or a naphthalene ring, and more preferably a structure including a benzene ring); and examples thereof include divalent residues of pyrrole, pyridine, pyrimidine, imidazole, thiazole, dithienobenzene, benzothiadiazole, quinoline, benzothiophene, dibenzothiophene, benzofuran, dibenzofuran, etc., with divalent residues of dithienobenzene, benzothiophene, dibenzothiophene, benzofuran and dibenzofuran being preferable.

In the general formula (1), n represents an integer of from 1 to 20, and though n may be 1 or the plural number of 2 or more, it is preferably an integer of from 1 to 5. When n falls within the range of from 1 to 20, the compound contributes to an enhancement of the mobility because it effectively coordinates with the substrate.

In the foregoing general formulae (2) and (3), it is preferable that all of $R_1$, $R_2$, $R_4$, $R_5$, $R_6$, $R_7$, $R_9$ and $R_{10}$ are a hydrogen atom; and that at least one of $R_3$ and $R_8$ is a halogen atom, an alkyl group having from 1 to 8 carbon atoms, a haloalkyl group having from 1 to 8 carbon atoms, a haloalkoxyl group having from 1 to 8 carbon atoms, an alkylamino group having from 1 to 8 carbon atoms or a dialkylamino group having from 2 to 16 carbon atoms (the alkyl groups may be bonded to each other to form a nitrogen atom-containing cyclic structure), and when at least one of $R_3$ and $R_8$ is not a halogen atom, an alkyl group, a haloalkyl group, a haloalkoxyl group, an alkylamino group or a dialkylamino group, then it is a hydrogen atom. This case is preferable because the compound takes a more minute orientation structure.

In the present invention, the compound represented by the general formula (1) is preferably a compound represented by the following general formula (4).

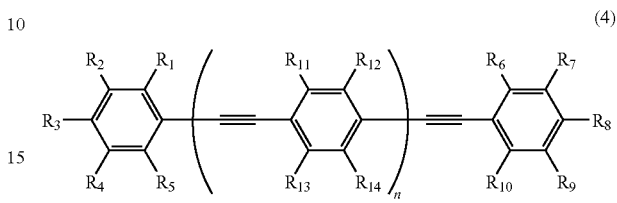

(4)

In the general formula (4), $R_1$ to $R_{14}$ each represents the same group as in $R_1$ to $R_{10}$ in the general formula (1); and specific examples thereof are also the same. $R_1$ to $R_5$, $R_6$ to $R_{10}$, $R_{11}$ to $R_{12}$ and $R_{13}$ to $R_{14}$ may each form a saturated or unsaturated cyclic structure together with an adjacent group thereto; and specific examples thereof are also the same. Also, n represents an integer of from 1 to 20, and preferably an integer of from 1 to 5. When n falls within the range of from 1 to 20, the compound contributes to an enhancement of the mobility because it effectively coordinates with the substrate.

In the foregoing general formula (4), it is preferable that $R_{11}$ to $R_{14}$ each independently represents a hydrogen atom, a halogen atom, an alkyl group having from 1 to 8 carbon atoms, a haloalkyl group having from 1 to 8 carbon atoms, an alkoxyl group having from 1 to 8 carbon atoms, an alkylthio group having from 1 to 8 carbon atoms, an alkylamino group having from 1 to 8 carbon atoms, a dialkylamino group having from 2 to 8 carbon atoms (the alkyl groups may be bonded to each other to form a nitrogen atom-containing cyclic structure), an alkylsulfonyl group having from 1 to 8 carbon atoms or a cyano group.

Also, in the foregoing general formula (4), it is preferable that all of $R_1$, $R_2$, $R_4$, $R_5$, $R_6$, $R_7$ and $R_9$ to $R_{14}$ are a hydrogen atom; and that at least one of $R_3$ and $R_8$ is a halogen atom, an alkyl group having from 1 to 8 carbon atoms, a haloalkyl group having from 1 to 8 carbon atoms, a haloalkoxyl group having from 1 to 8 carbon atoms, an alkylamino group having from 1 to 8 carbon atoms or a dialkylamino group having from 2 to 16 carbon atoms (the alkyl groups may be bonded to each other to form a nitrogen atom-containing cyclic structure), and when at least one of $R_3$ and $R_8$ is not a halogen atom, an alkyl group, a haloalkyl group, a haloalkoxyl group, an alkylamino group or a dialkylamino group, then it is a hydrogen atom. This case is preferable because the compound takes a more minute orientation structure.

Furthermore, in the general formula (4), when any one of $R_1$ to $R_{14}$ is a fluorine atom, a cyano group, a trifluoromethyl group or a pentafluoroethyl group, the compound is preferable as a material for an n-type transistor.

Also, in the present invention, when the compound represented by the general formula (1) is a compound represented by the following general formula (5), it takes a linear, minute alignment structure, and such is preferable.

(5)

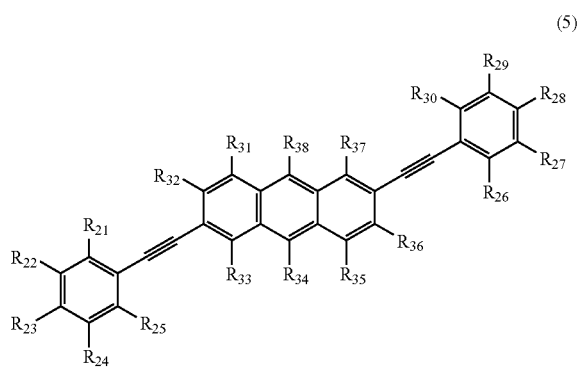

In the general formula (5), $R_{21}$ to $R_{38}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group; and each of these groups may have a substituent. Specific examples of each of these groups are the same as the specific examples of $R_1$ to $R_{10}$ of the foregoing general formula (1).

Also, $R_{21}$ to $R_{25}$ and $R_{26}$ to $R_{30}$ may each form a saturated cyclic structure together with an adjacent group thereto; and specific examples of the cyclic structure are the same as the foregoing specific examples.

Also, in the general formula (5), it is preferable that $R_{21}$ to $R_{38}$ each independently represents a hydrogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group.

Also, examples of the substituent which each of the groups described in the general formulae (1), (4) and (5) may have include the same groups as in $R_1$ to $R_{10}$ of the foregoing general formula (1).

Specific examples the compounds represented by the general formulae (1), (4) and (5) to be used in the organic semiconductor layer of the organic thin film transistor of the present invention will be given below, but it should not be construed that the present invention is limited thereto.

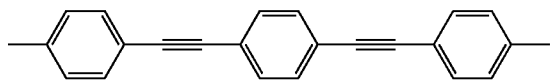

(1)          (2)

(3)          (4)

(5)

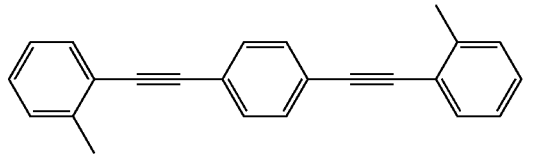

(6)

(7)

-continued
(8)
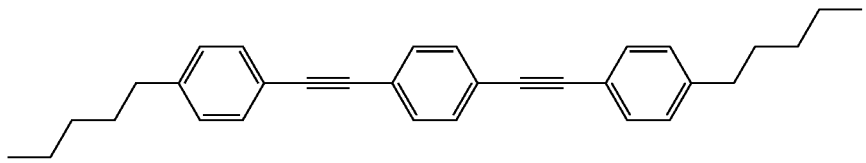
(9)
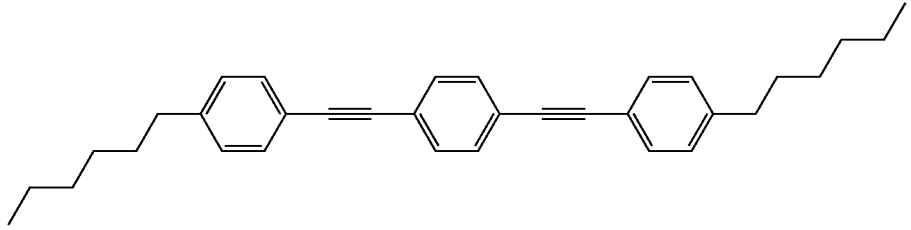
(10)
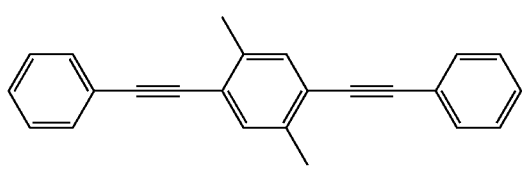
(11)
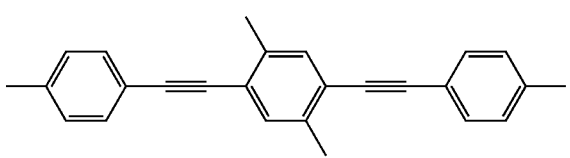
(12)
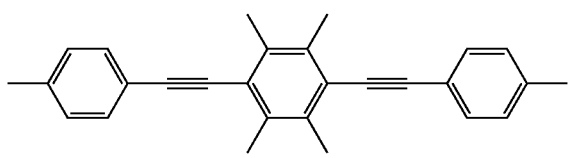
(13)
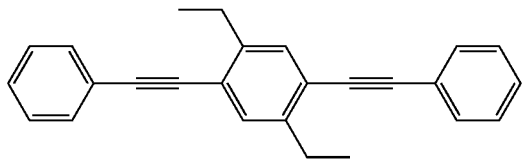
(14)
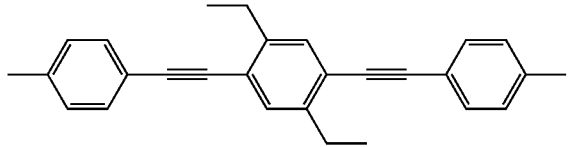
(15)
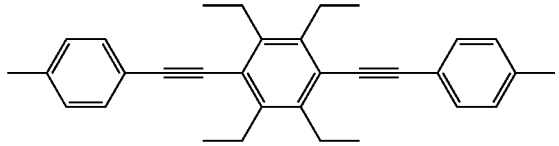
(16)
(17)
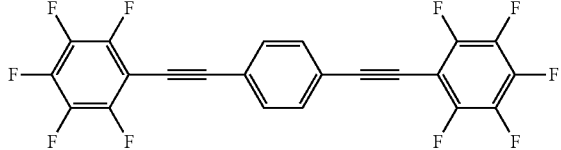
(18)
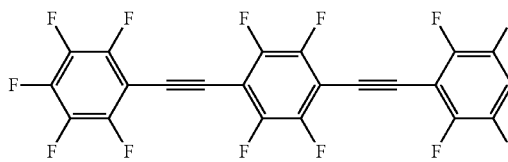
(19)
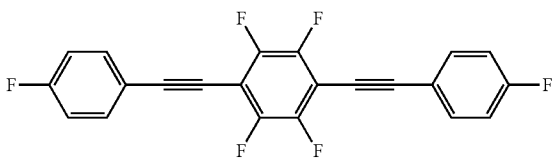
(20)
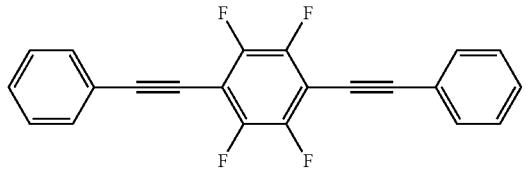
(21)
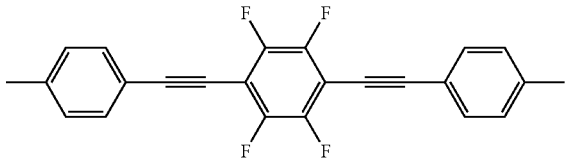
(22) (23)
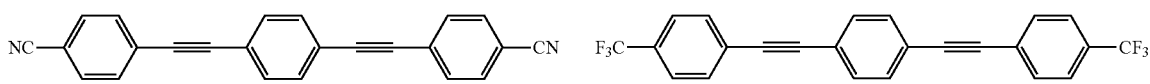

-continued
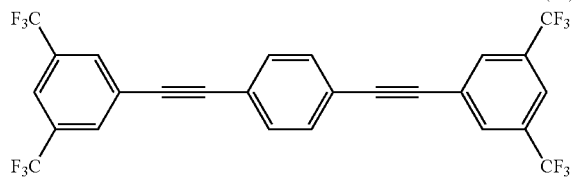
(24)
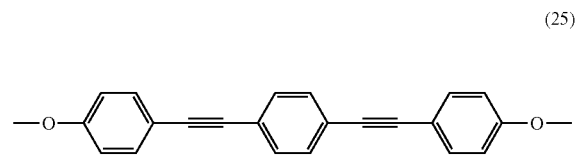
(25)
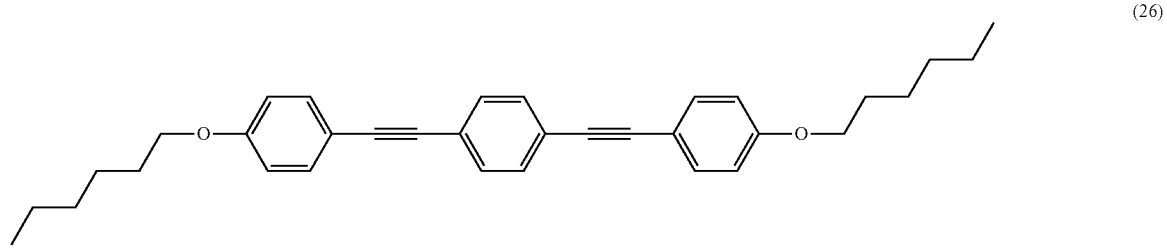
(26)
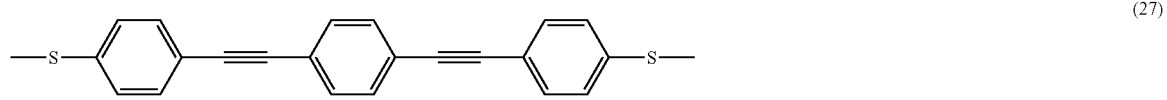
(27)
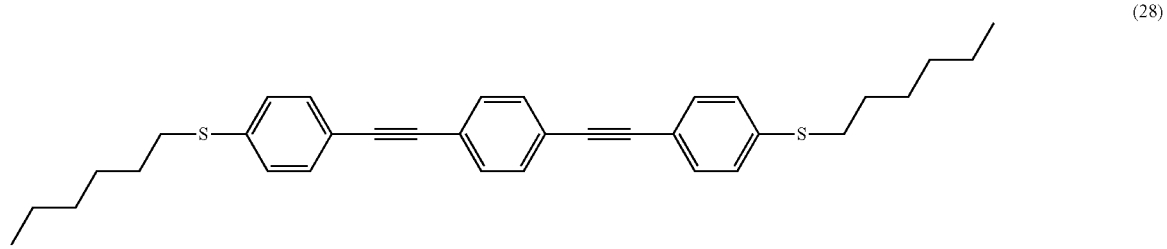
(28)
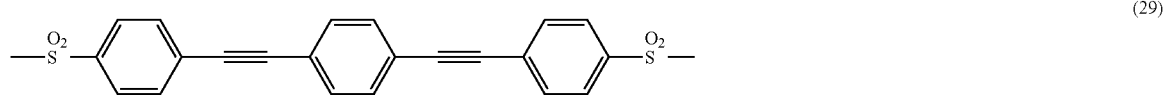
(29)
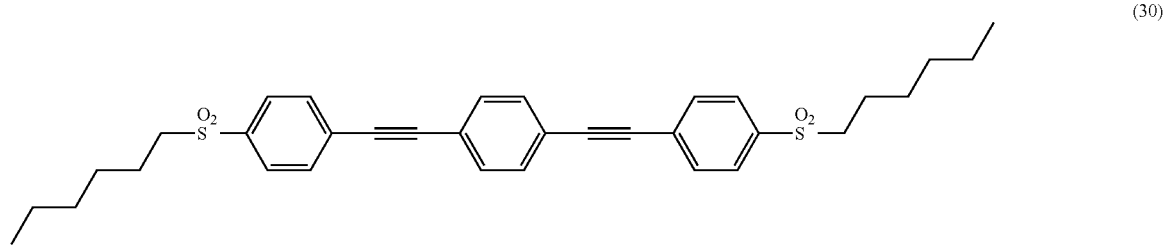
(30)
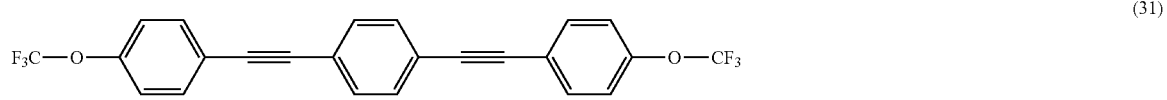
(31)
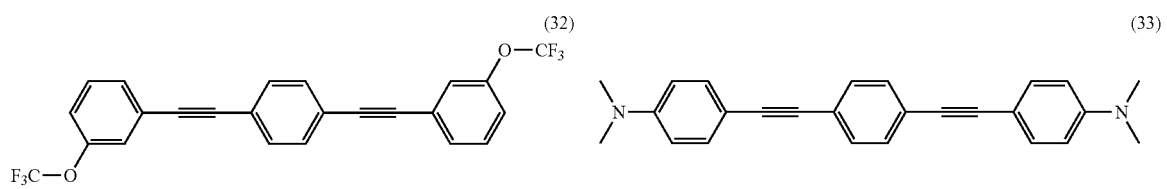
(32)
(33)
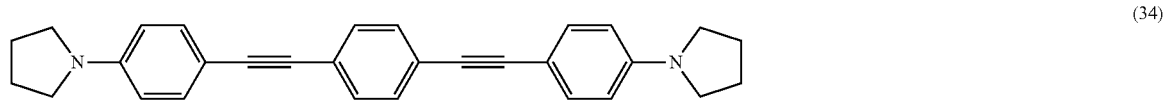
(34)

-continued
(35)
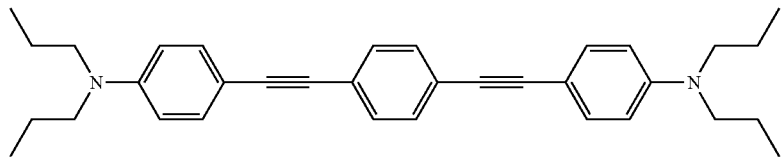
(36)
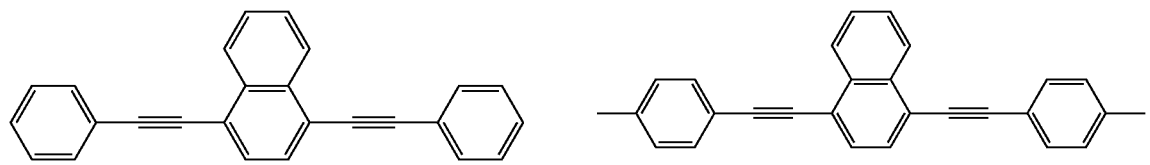
(37)
(38)
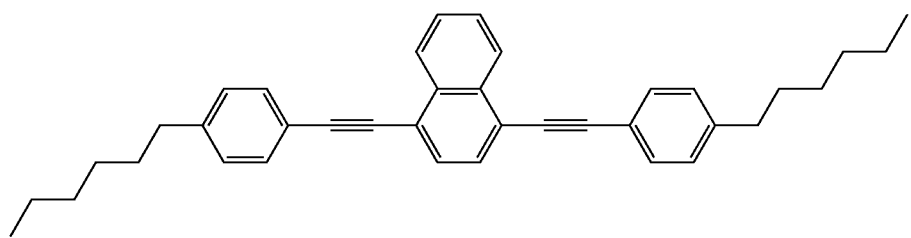
(39)
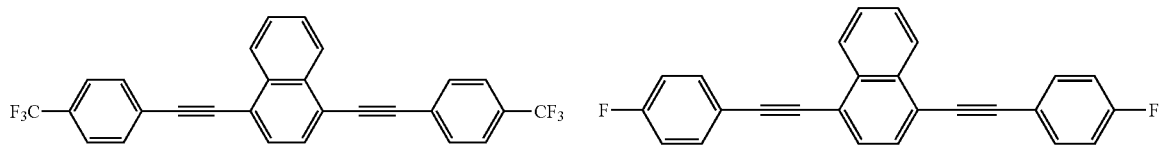
(40)
(41)
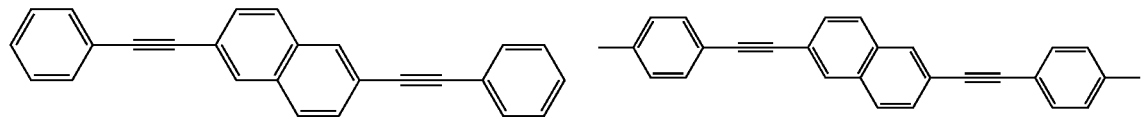
(42)
(43)
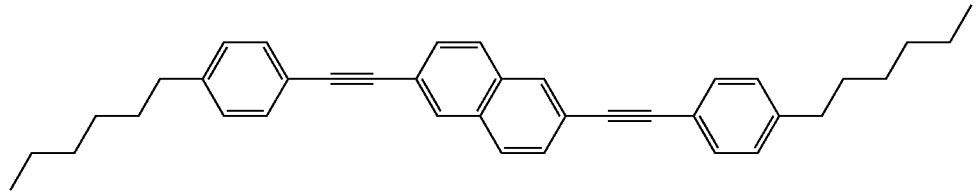
(44)
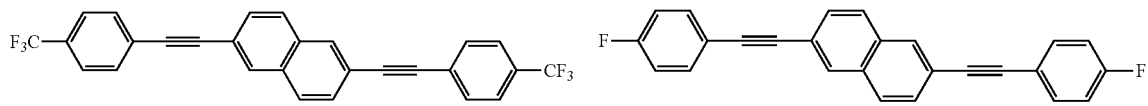
(45)
(46)
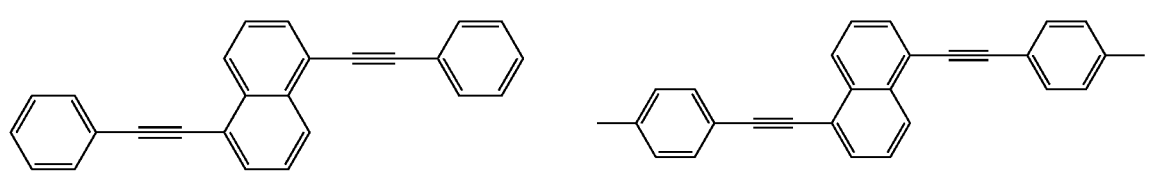
(47)

-continued
(48)
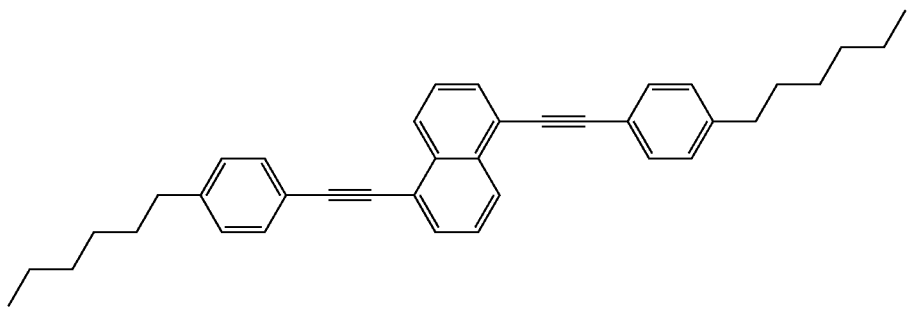
(49)
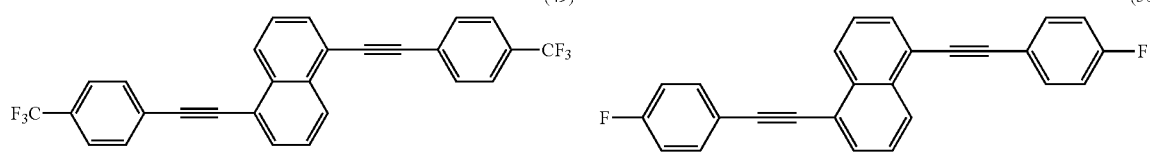
(50)
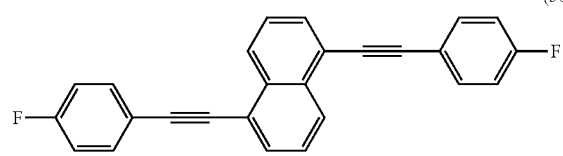
(51)
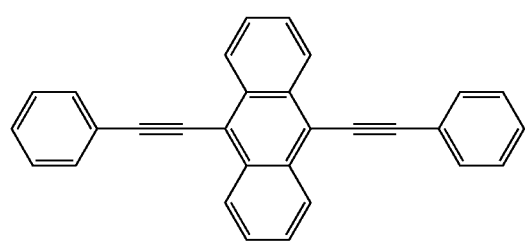
(52)
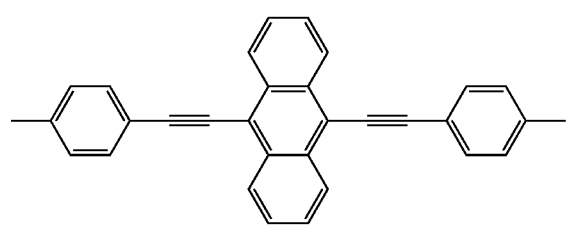
(53)
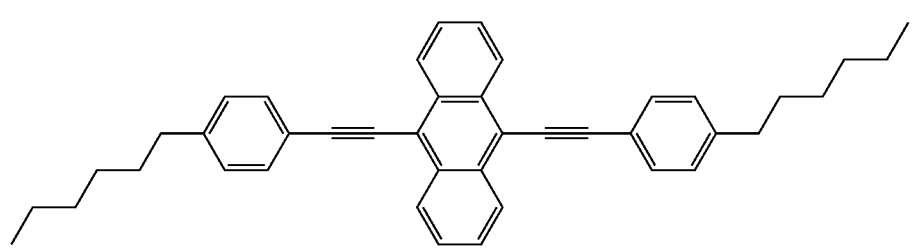
(54)
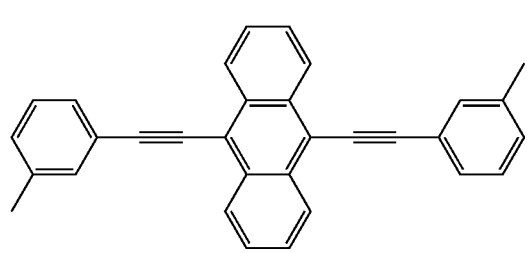
(55)
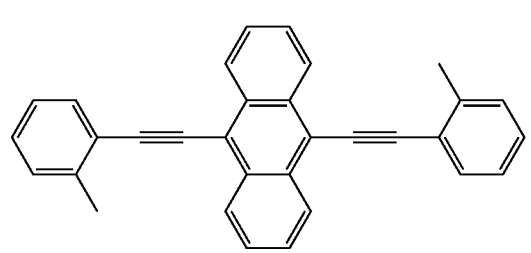
(56)
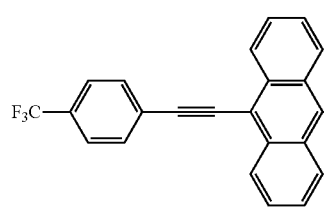
(57)
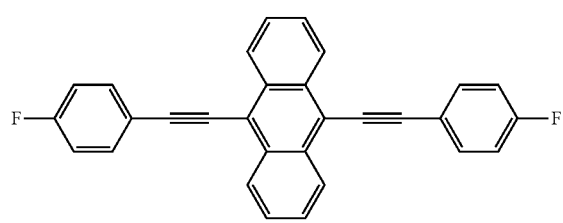

-continued
(58)
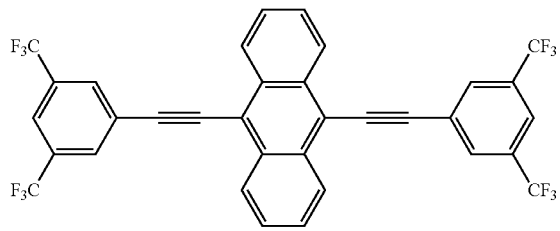
(59)
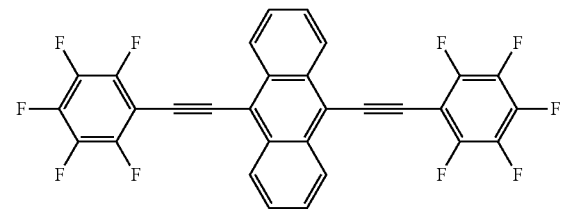
(60)
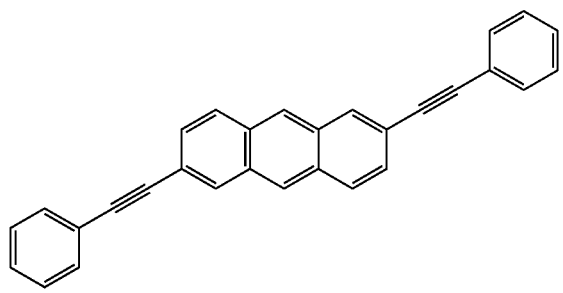
(61)
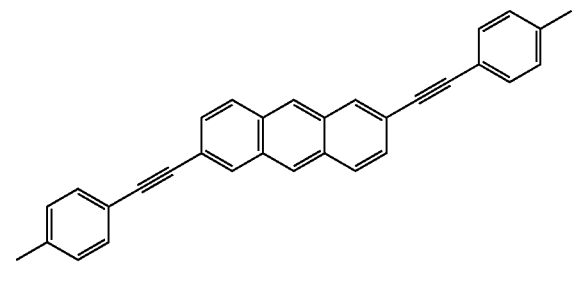
(62)
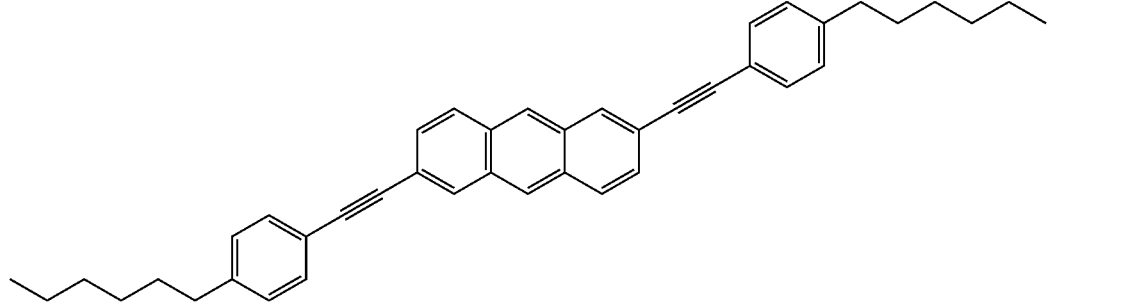
(63)
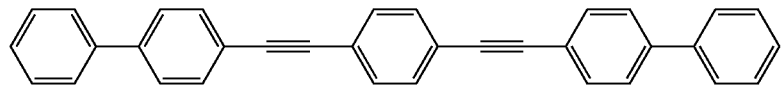
(64)
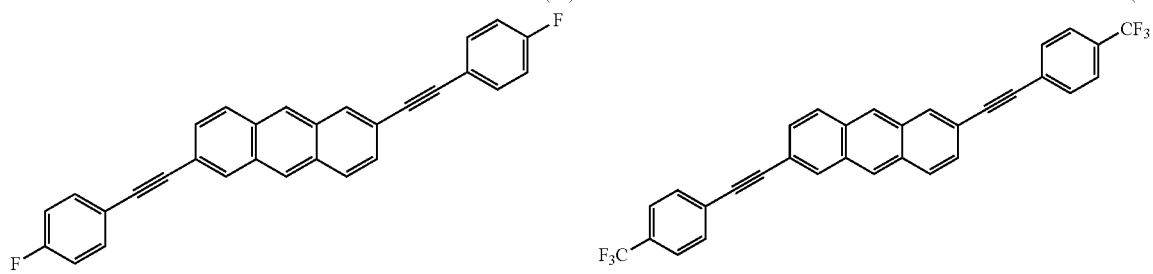
(65)
(66)
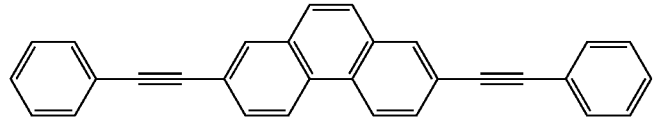
(67)
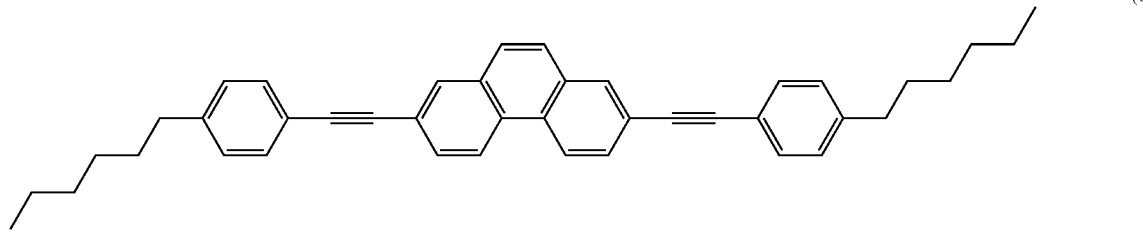

-continued
(68)
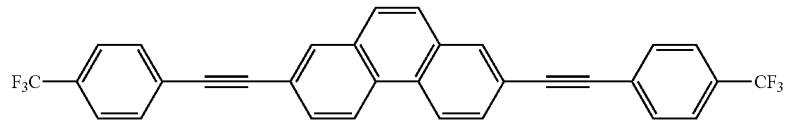
(69)
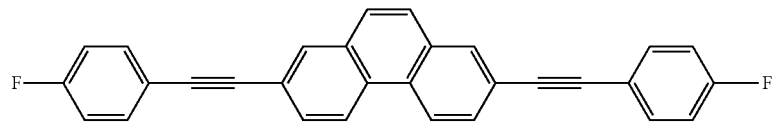
(70)
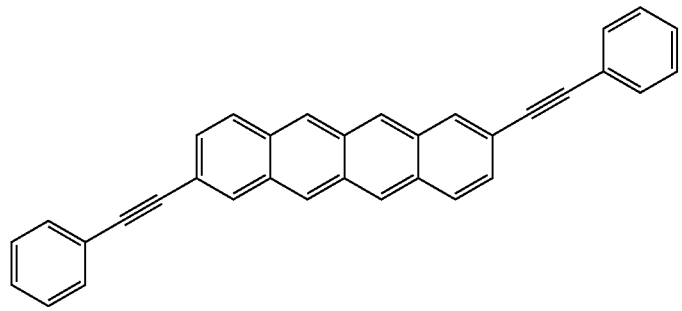
(71)
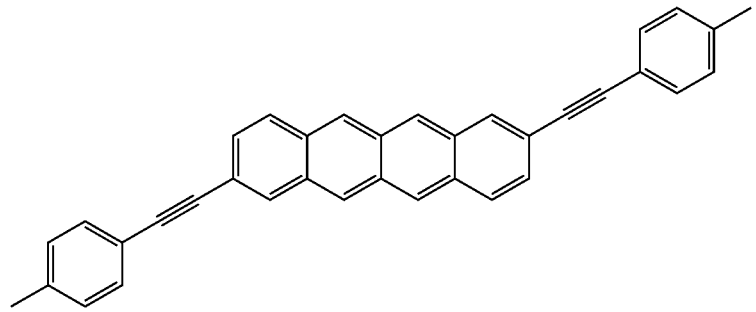
(72)
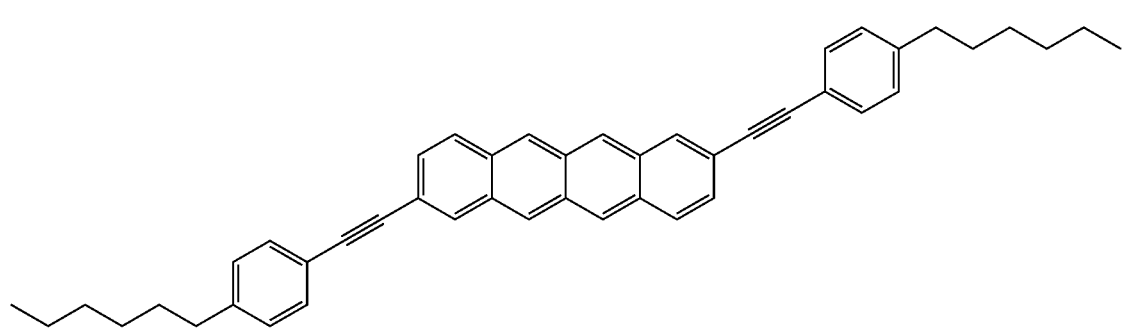
(73)
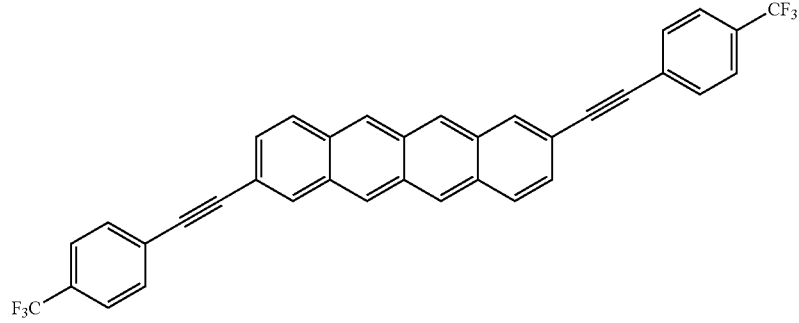

-continued
(74)
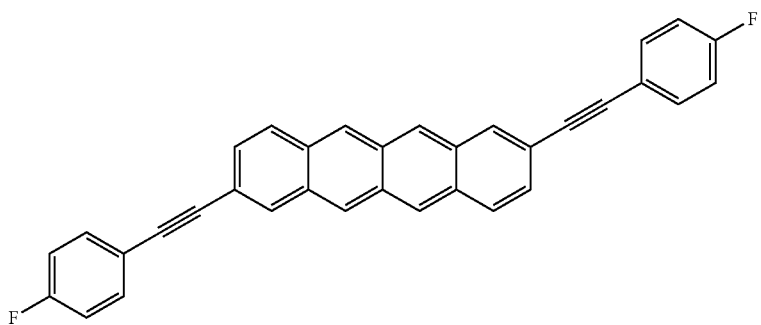
(75)
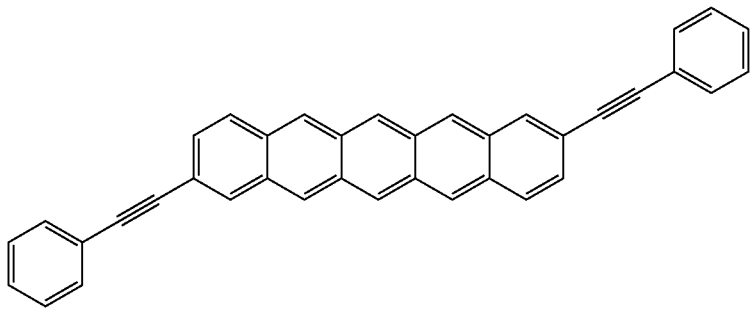
(76)
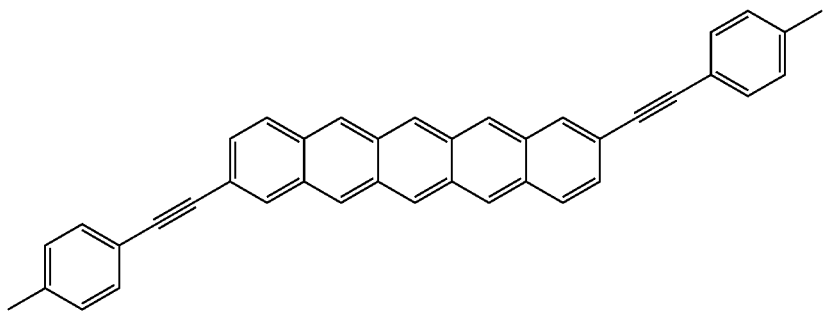
(77)
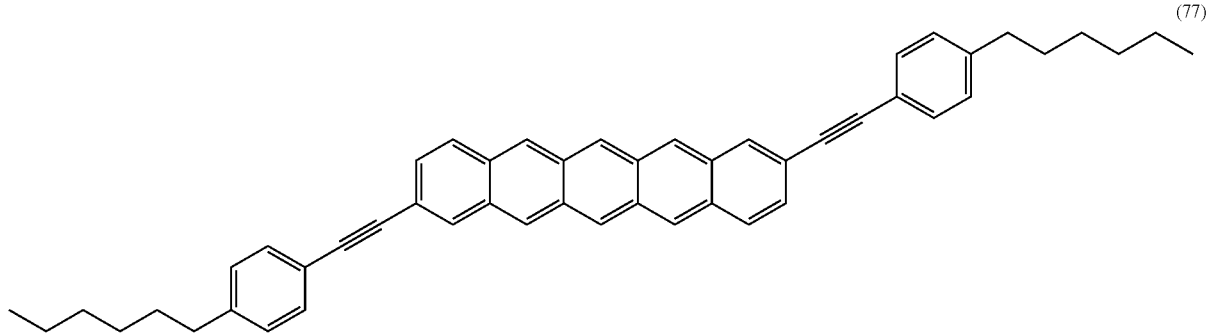
(78)
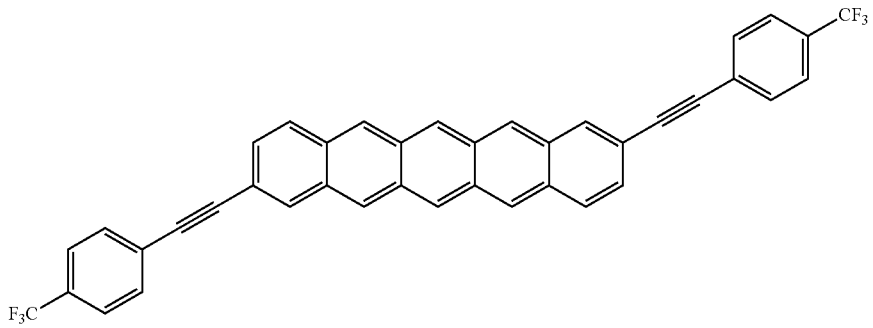

(79)
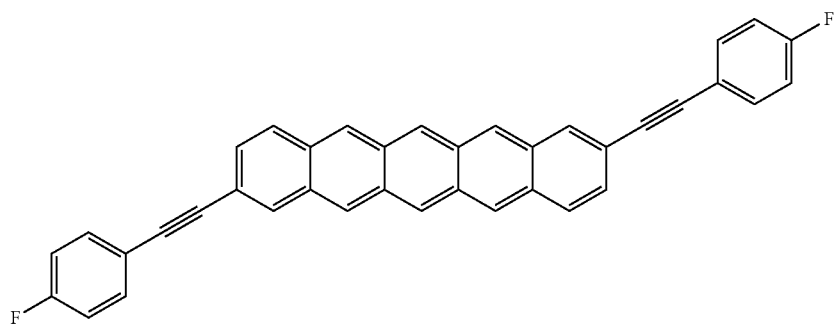
(80)
(81)
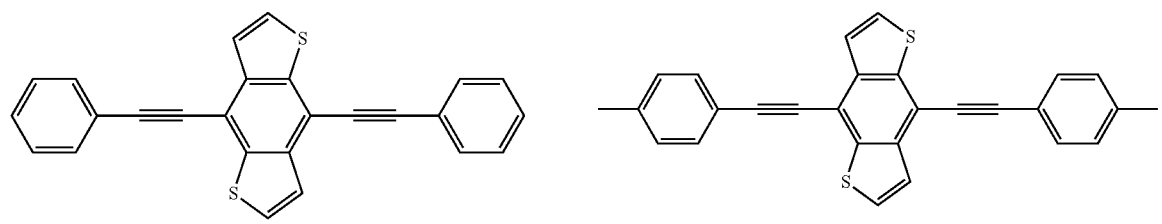
(82)
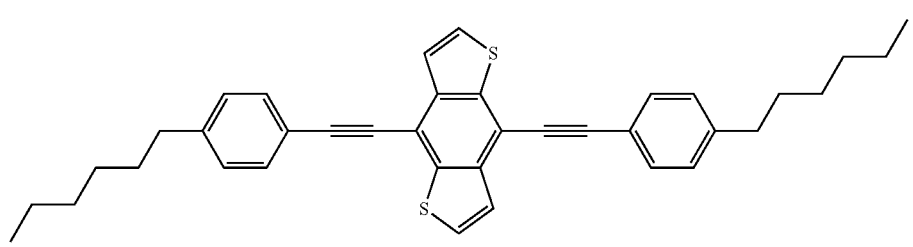
(83)
(84)
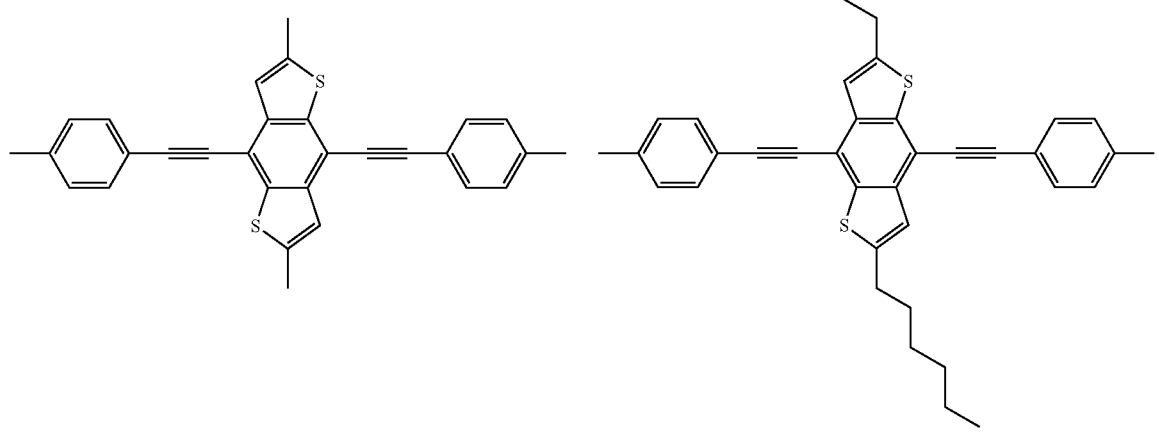

-continued
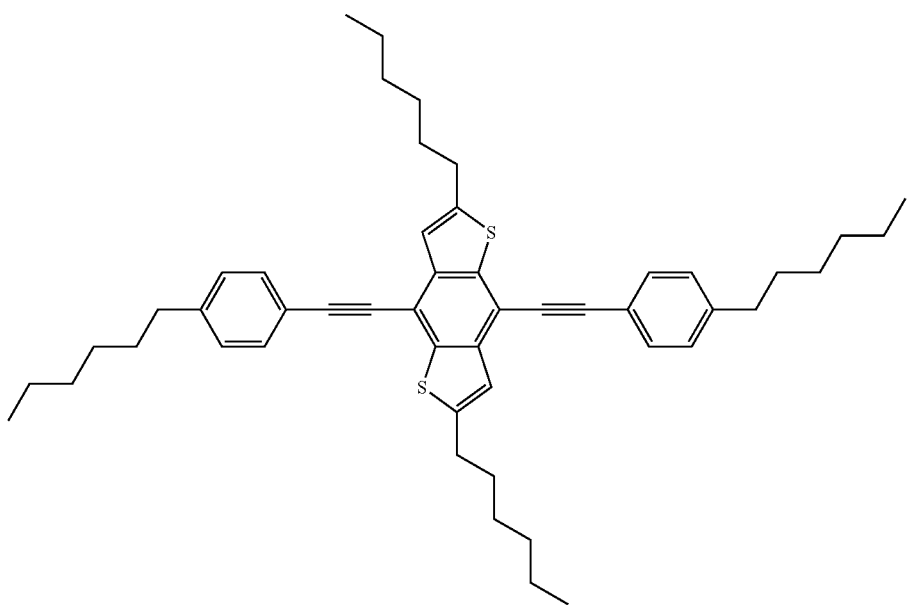
(85)
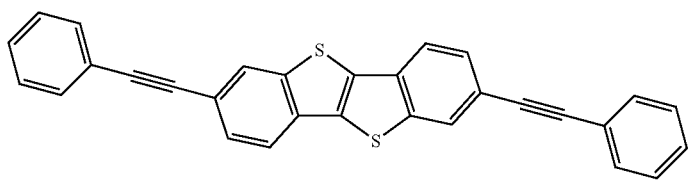
(86)
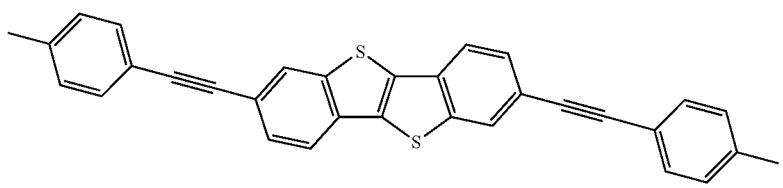
(87)
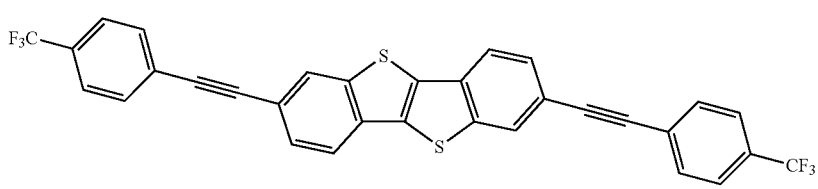
(88)
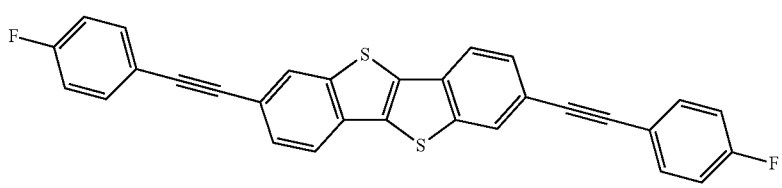
(89)
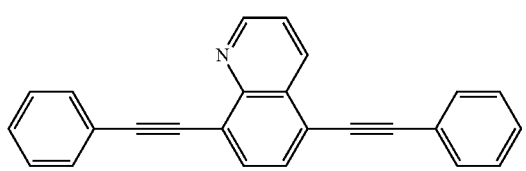
(90)
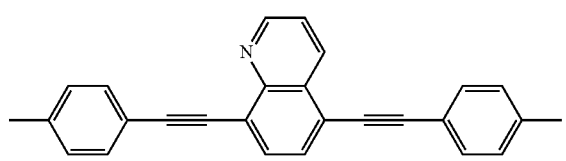
(91)

-continued
(92) 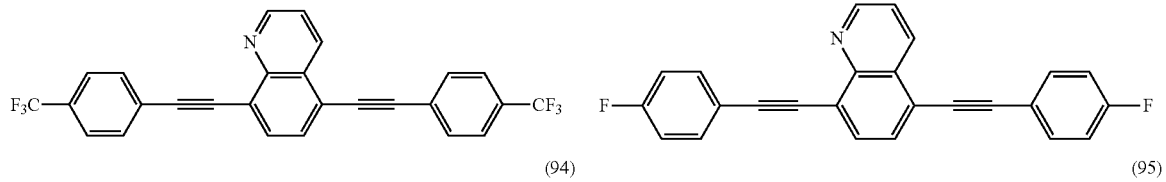
(93)
(94) 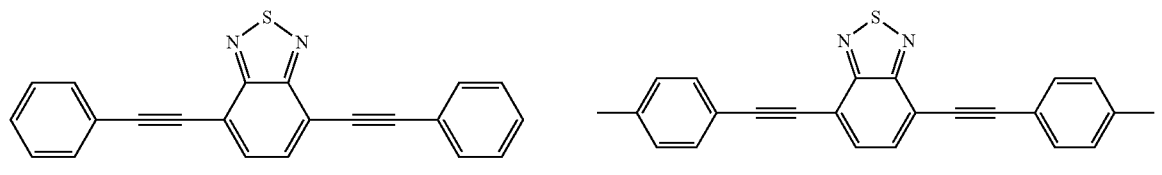
(95)
(96) 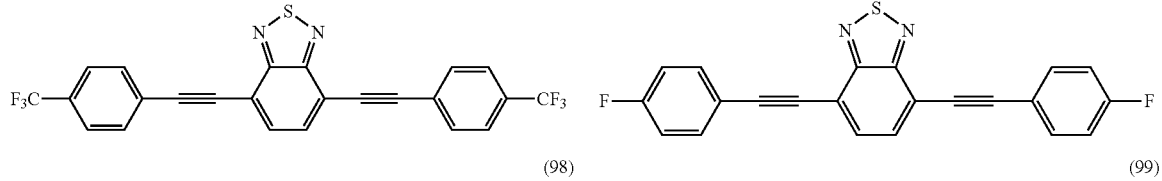
(97)
(98) 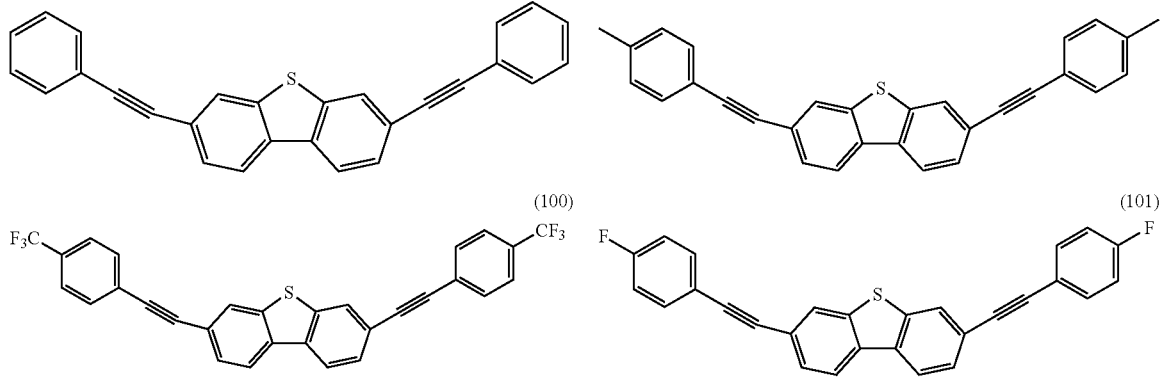
(99)
(100)
(101)
(102)
(103)
(104) 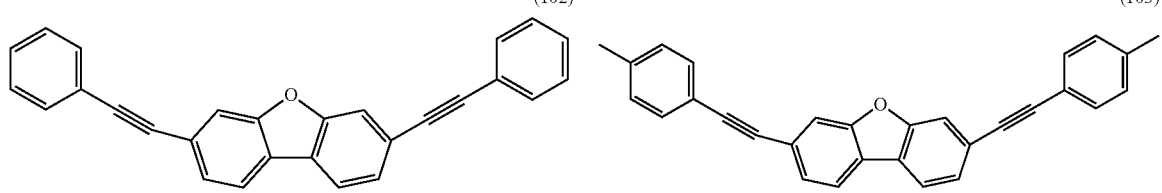
(105)
(106) 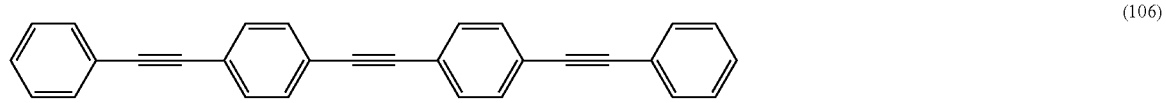
(107) 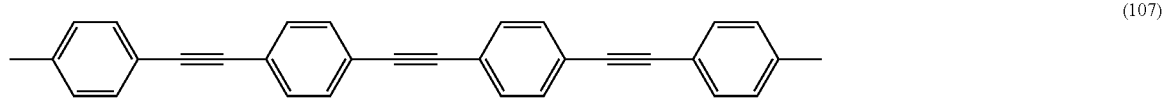

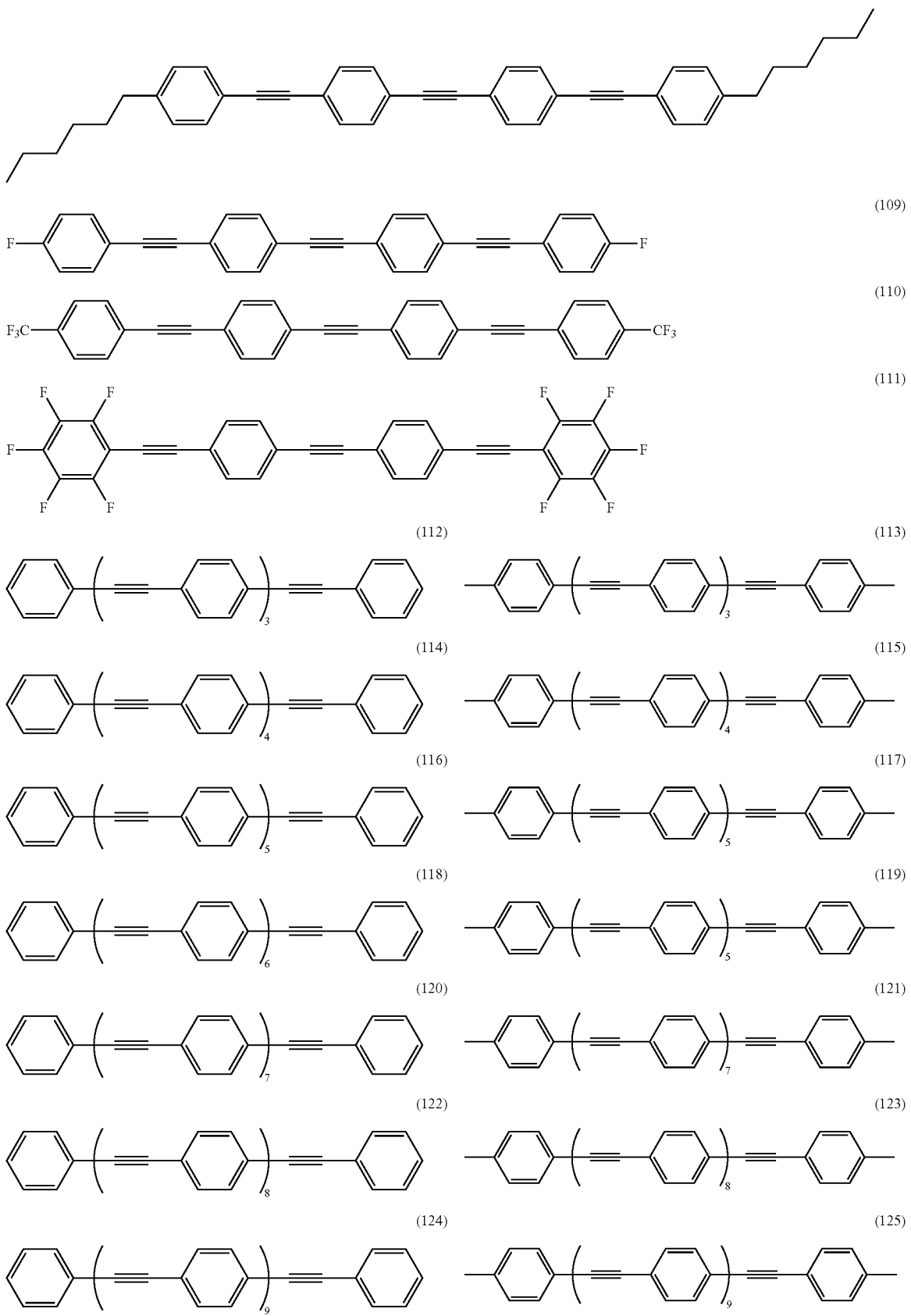

-continued
(126) 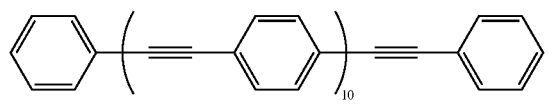
(127) 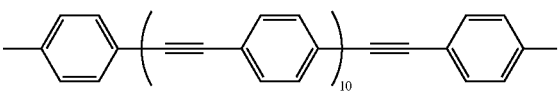
(128) 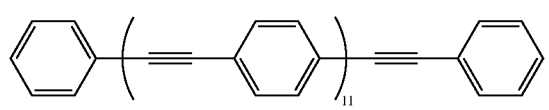
(129) 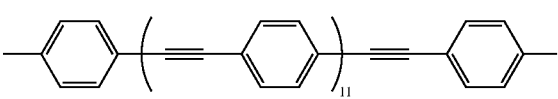
(130) 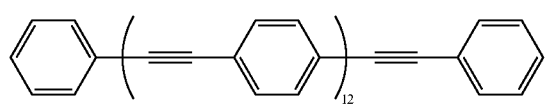
(131) 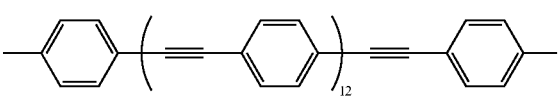
(132) 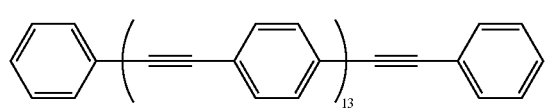
(133) 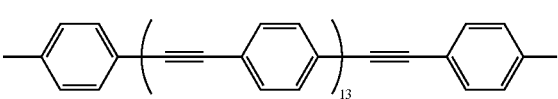
(134) 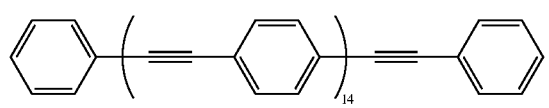
(135) 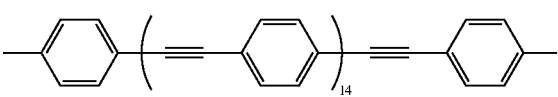
(136) 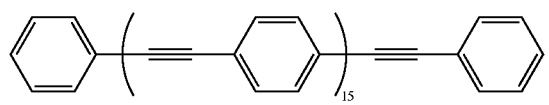
(137) 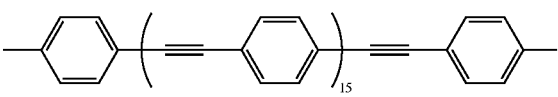
(138) 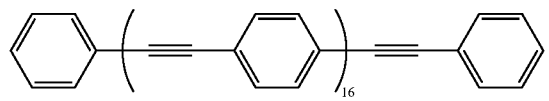
(139) 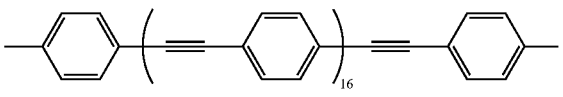
(140) 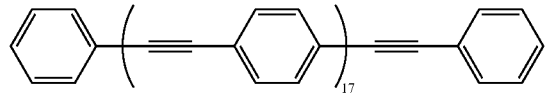
(141) 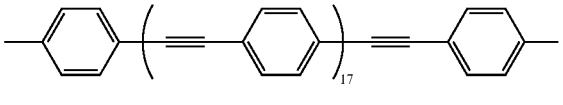
(142) 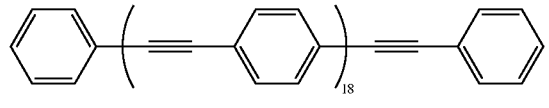
(143) 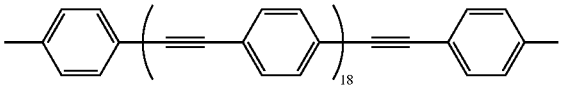
(144) 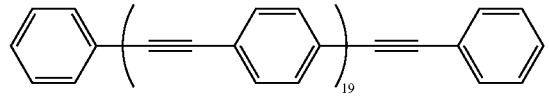
(145) 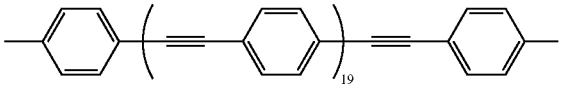
(146) 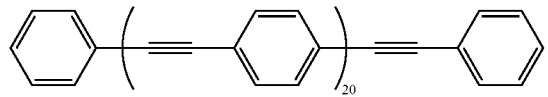
(147) 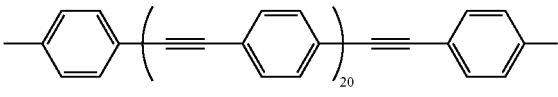
(148) 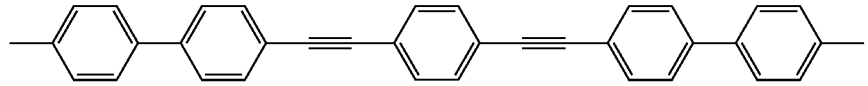
(149) 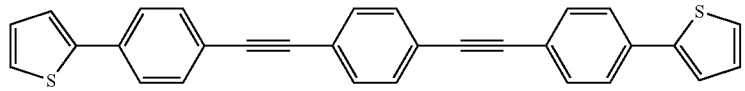

-continued
(150)
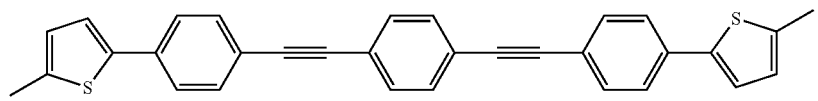
(151)
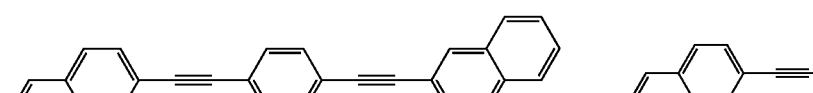
(152)
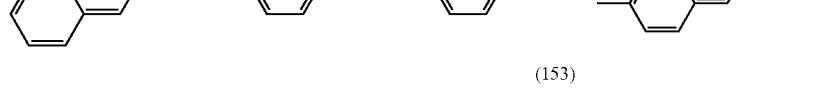
(153)
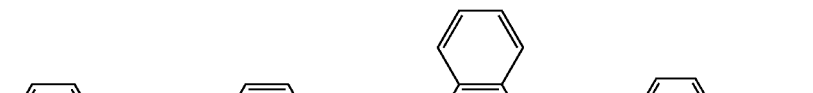
(154)
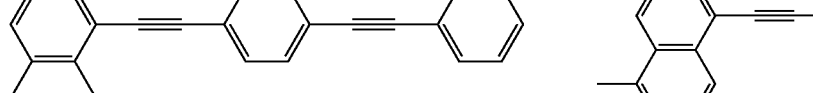
(155)
(156)
(157)
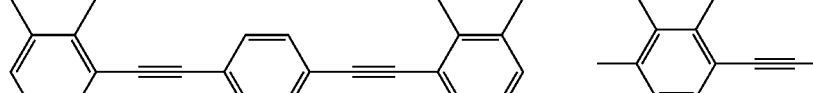
(158)
(159)
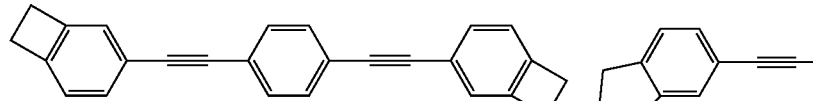
(160)
(161)
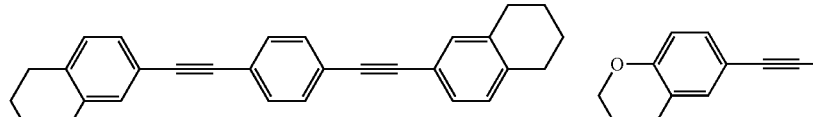
(162)
(163)
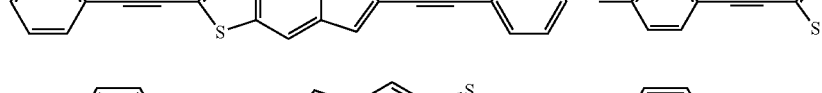
(164)
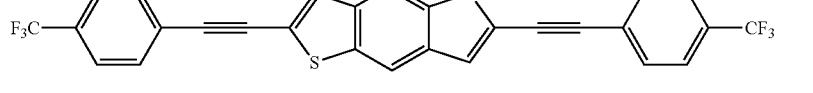

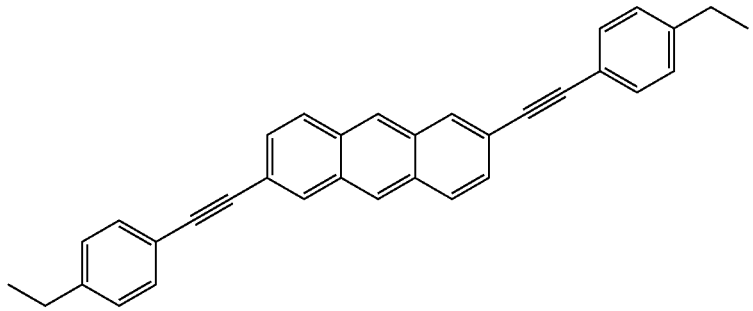
(165)
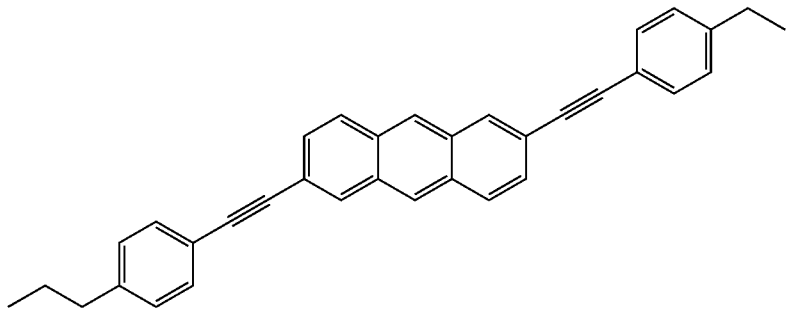
(166)
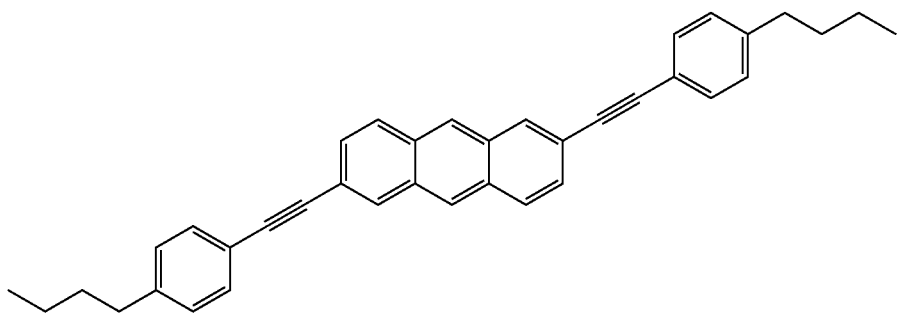
(167)
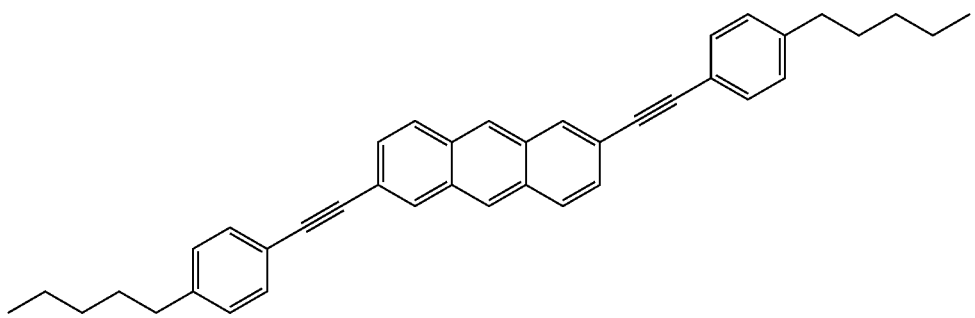
(168)
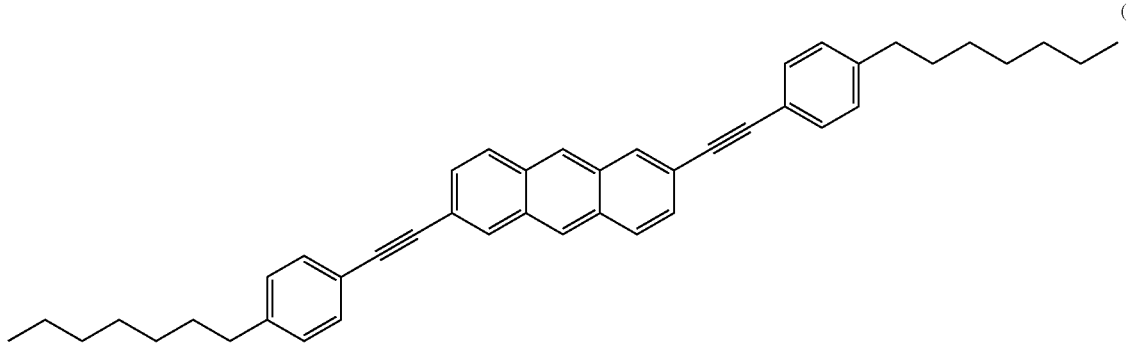
(169)

-continued
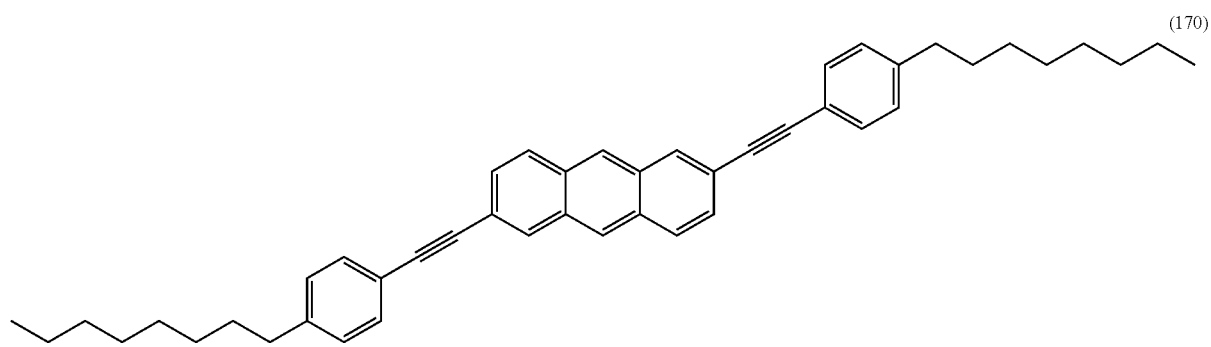
(170)
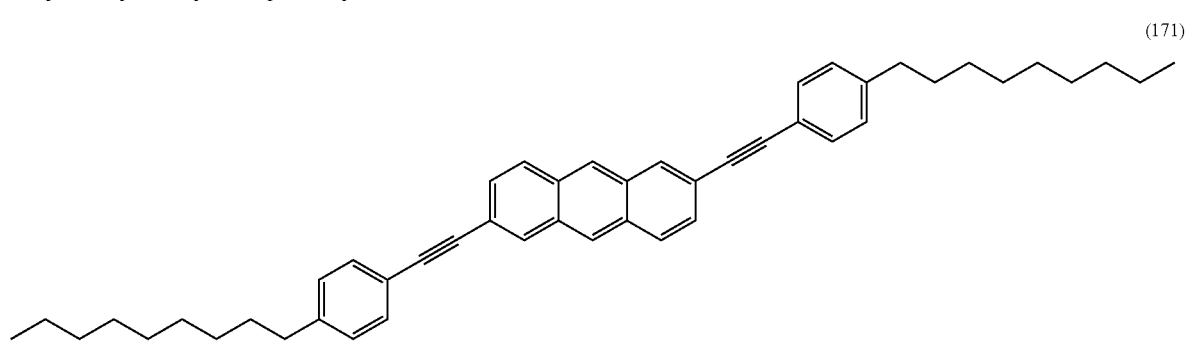
(171)
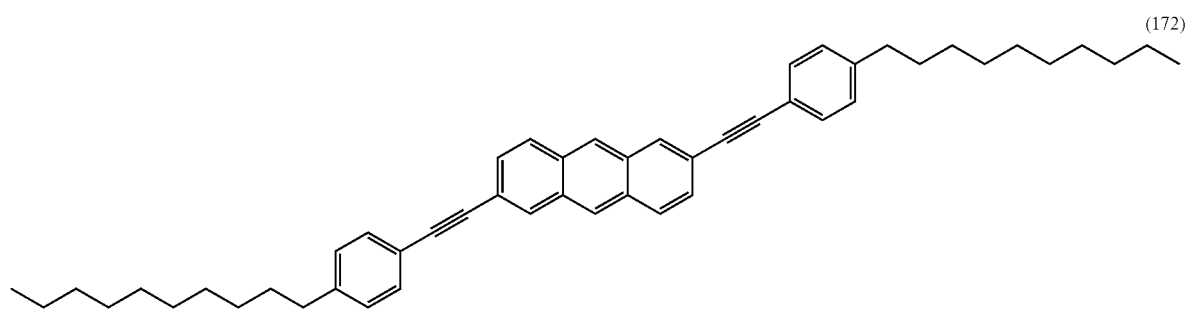
(172)
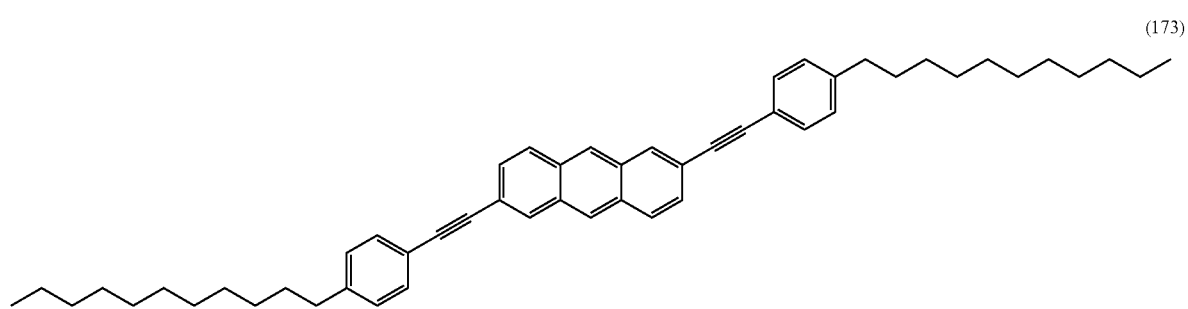
(173)
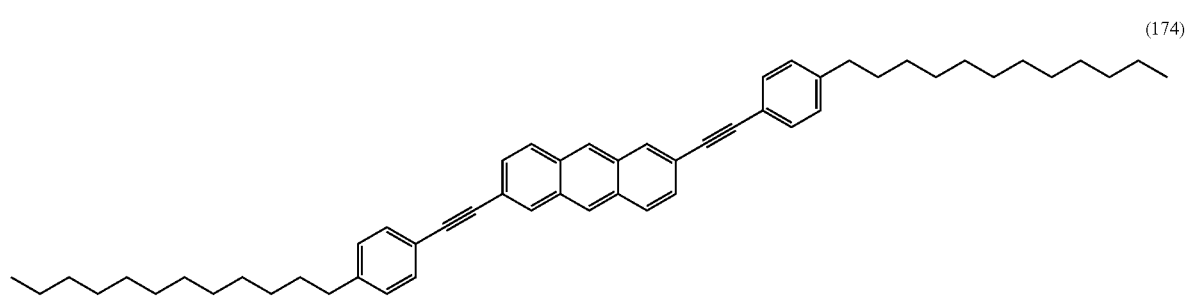
(174)

(175)
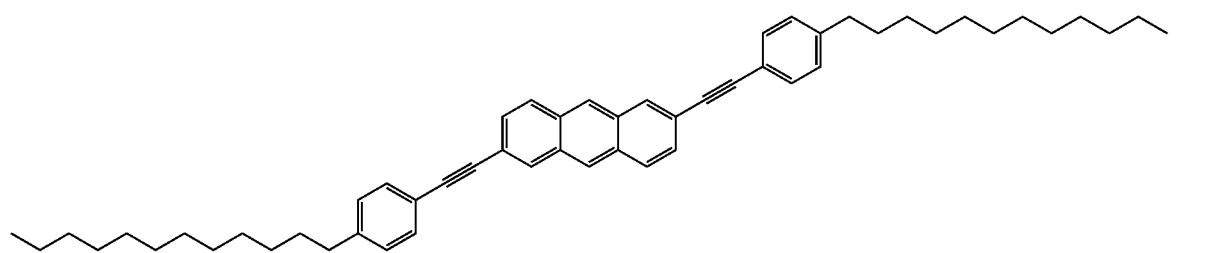
(176)
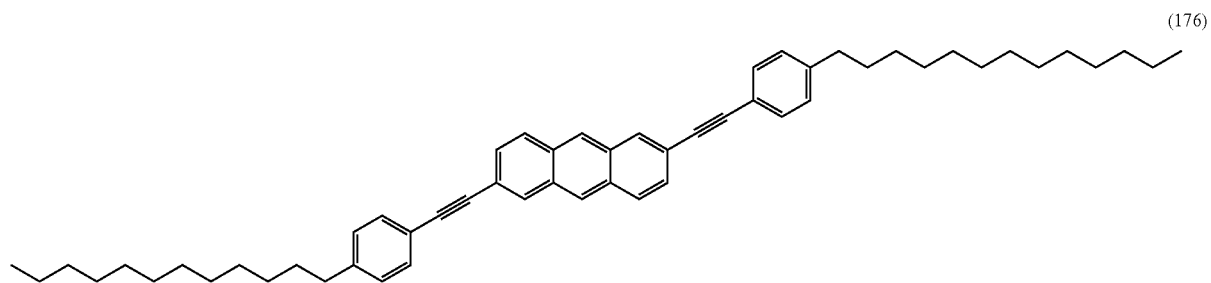
(177)
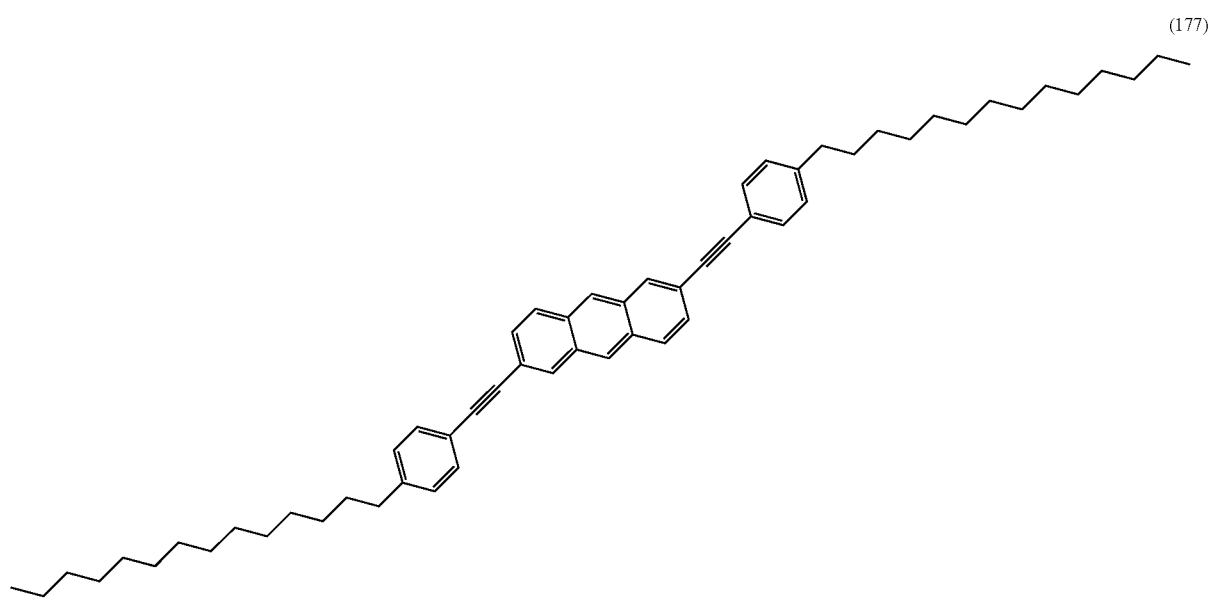
(178)
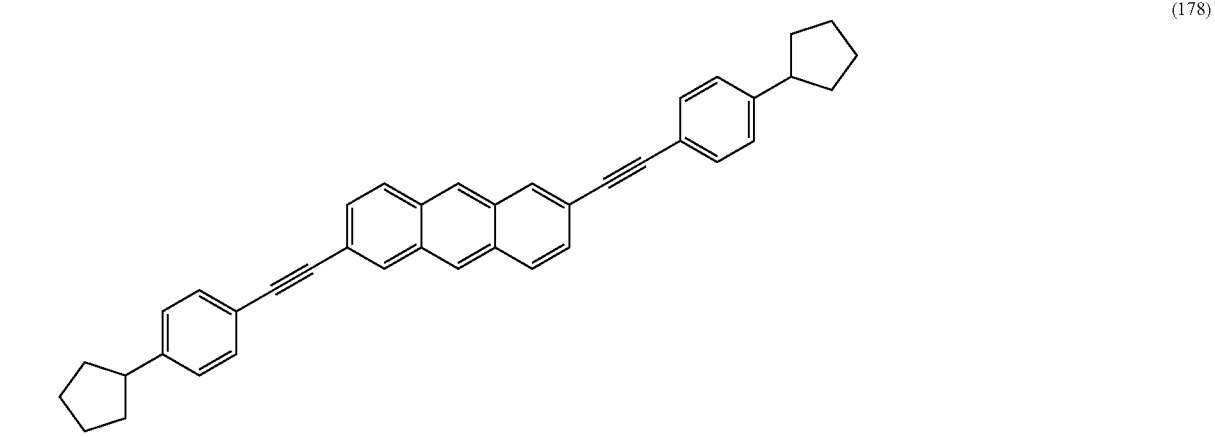

-continued
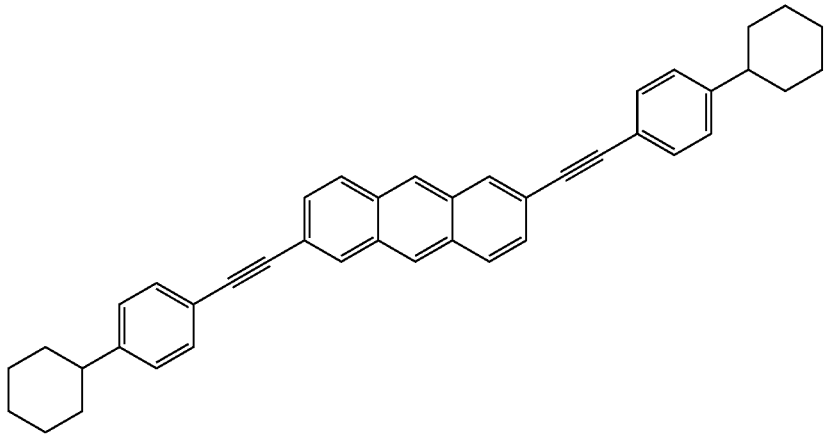
(179)
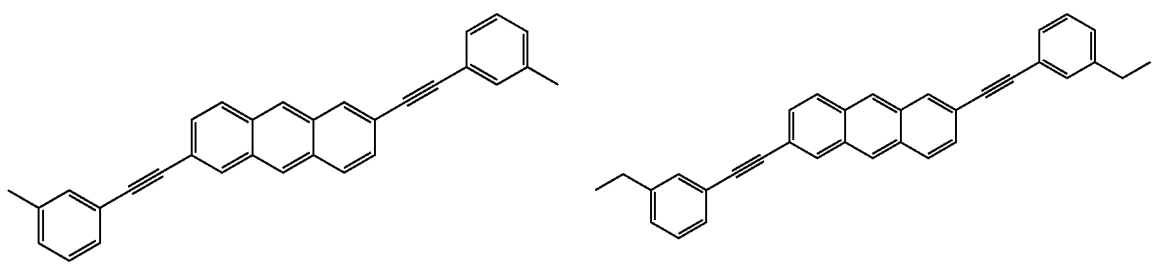
(180) (181)
(182) (183)
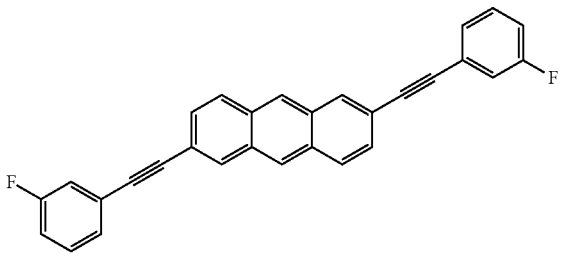
(184) (185)
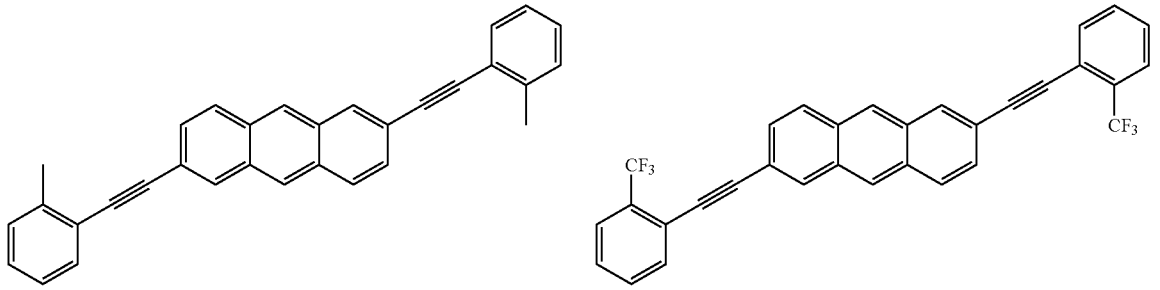
(186)
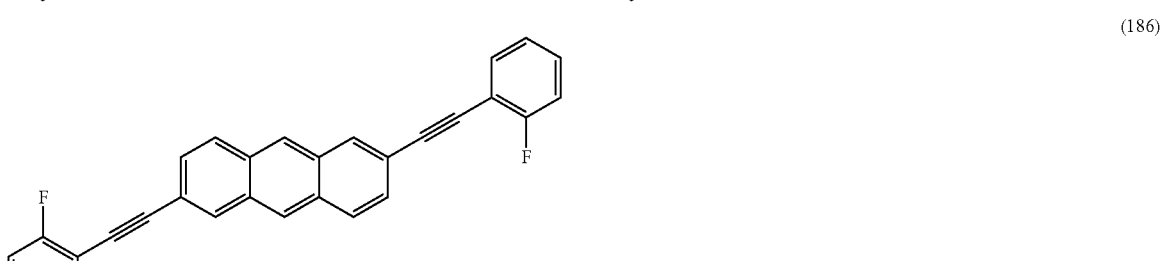

In electronic devices such as the organic thin film light emitting transistor of the present invention, a device with high electric field effect mobility and ON/OFF ratio can be obtained by using a high-purity material. Accordingly, it is desirable to apply purification by a measure such as column chromatography, recrystallization, distillation, sublimation, etc. as the need arises. Preferably, it is possible to enhance the purity by repeating such a purification method or combining the plural of these methods. Furthermore, it is desirable to repeat the sublimation purification as a final step of the purification at least two times or more as the need arises. By using such a measure, it is preferred to use a material having a purify, as measured by HPLC, of 90% or more. There is a possibility that by using a material having a purity of more preferably 95% or more, and especially preferably 99% or more, the electric field effect mobility and the ON/OFF ratio of the organic thin film transistor can be increased, thereby revealing an inherent performance of the material.

The device configuration of the organic thin film transistor of the present invention is hereunder described.

The device configuration of the organic thin film transistor of the present invention is not limited so far as it is concerned with a thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode. Those having a known device configuration may be employed. Of these, representative device configurations of the organic thin film transistor are shown as devices A to D in FIGS. 1 to 4. As described above, there are known some configurations regarding the locations of electrodes, the lamination order of layers and so on. The organic thin film transistor of the present invention has a field effect transistor (FET) structure. The organic thin film transistor has an organic semiconductor layer (organic compound layer), a source electrode and a drain electrode formed opposing each other at a prescribed interval and a gate electrode formed at a prescribed distance from each of the source electrode and the drain electrode, and a current flowing between the source and drain electrodes is controlled upon application of a voltage to the gate electrode. Here, the interval between the source electrode and the drain electrode is determined by the use purpose of the organic thin film transistor of the present invention and is usually from 0.1 μm to 1 mm, preferably from 1 μm to 100 μm, and more preferably from 5 μm to 100 μm.

Figure 2:
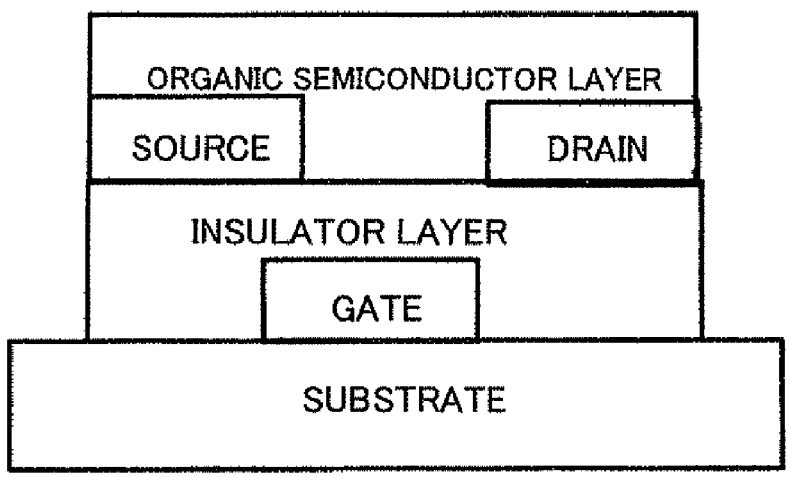
FIG. 2 is a view showing one embodiment of a device configuration of an organic thin film transistor of the present invention.
Figure 3:
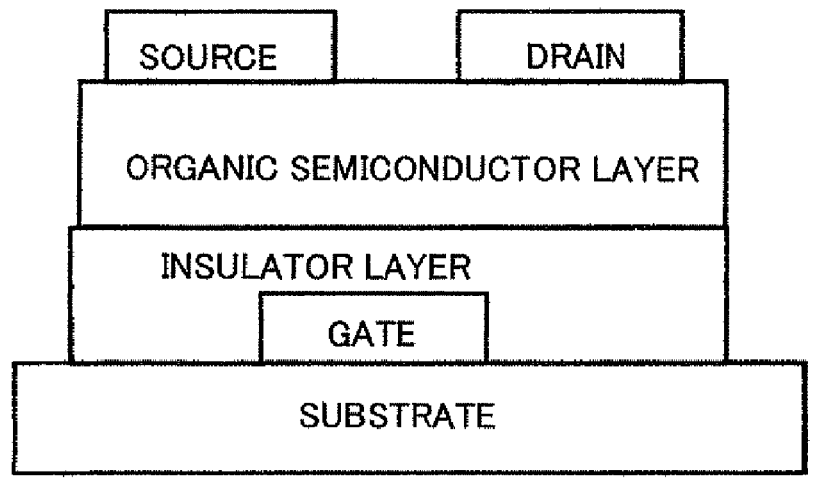
FIG. 3 is a view showing one embodiment of a device configuration of an organic thin film transistor of the present invention.

Among the devices A to D, the device B of FIG. 2 is described as an embodiment in more detail. The organic thin film transistor of the device B has a gate electrode and an insulator layer in this order on a substrate and has a pair of a source electrode and a drain electrode formed at a prescribed interval on the insulator layer, and an organic semiconductor layer is formed thereon. The organic semiconductor layer forms a channel region, and a current flowing between the source electrode and the drain electrode is controlled by a voltage to be applied to the gate electrode, thereby undergoing an ON/OFF operation.

Figure 5:
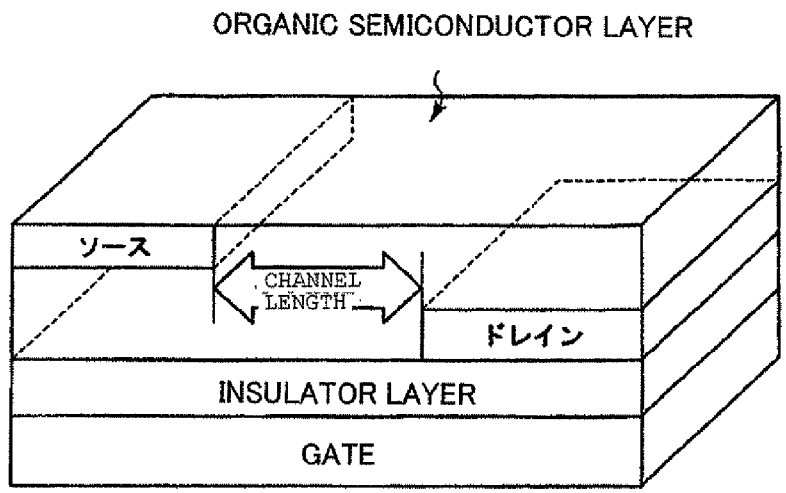
FIG. 5 is a view showing one embodiment of a device configuration of an organic thin film transistor of the present invention.
Figure 6:
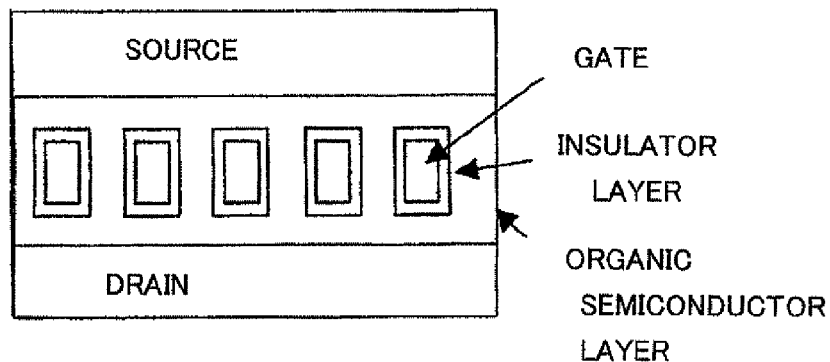
FIG. 6 is a view showing one embodiment of a device configuration of an organic thin film transistor of the present invention.

With respect to the organic thin film transistor of the present invention, various configurations are proposed as the organic thin film transistor for the device configuration other than the foregoing devices A to D. The device configuration is not limited to these device configurations so far as it has a mechanism revealing an effect for undergoing an ON/OFF operation or amplification with a current flowing between the source electrode and the drain electrode being controlled by a voltage to be applied to the gate electrode. Examples of the device configuration include a top and bottom contact type organic thin film transistor (see FIG. 5) proposed in the proceedings for the 49th Spring Meeting, The Japan Society of Applied Physics, 27a-M-3 (March 2002) by Yoshida, et al. in National Institute of Advanced Industrial Science and Technology and a vertical type organic thin film transistor (see FIG. 6) proposed on page 1440 in *IEEJ Transactions,* 118-A (1998) by Kudo, et al. of Chiba University.

(Substrate)

Figure 8:
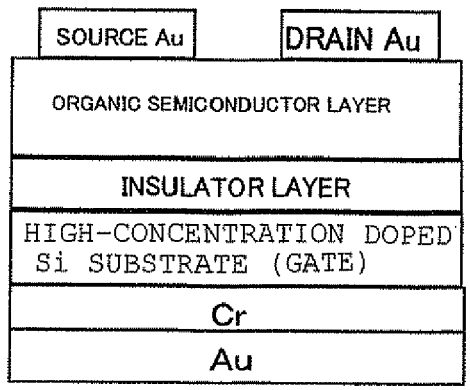
FIG. 8 is a view showing one embodiment of a device configuration of an organic thin film transistor in the Examples of the present invention.

The substrate in the organic thin film transistor of the present invention bears a role of supporting the structure of the organic thin film transistor. Besides glasses, inorganic compounds such as metal oxides or nitrides, etc., plastic films (for example, PET, PES or PC), metal substrates, composites or laminates thereof and so on can also be used as a material of the substrate. Also, in the case where the structure of the organic thin film transistor can be sufficiently supported by a configuration element other than the substrate, there is a possibility that the substrate is not used. Also, a silicon (Si) wafer is frequently used as a material of the substrate. In that case, Si itself can be used as the substrate also serving as the gate electrode. Also, it is possible to oxidize the surface of Si to form $SiO_2$, thereby utilizing it as an insulating layer. In that case, there may be the case where a metal layer such as Au, etc. is fabricated as an electrode for connecting a lead wire on the Si substrate of the gate electrode also serving as the substrate. An embodiment of the device configuration of the organic thin film transistor using an Si substrate is shown in FIG. 8.

(Electrode)

Materials of the gate electrode, the source electrode and the drain electrode in the organic thin film transistor of the present invention are not particularly limited so far as they are a conductive material. Examples thereof include platinum, gold, silver, nickel, chromium, copper, iron, tin, antimony-lead, tantalum, indium, palladium, tellurium, rhenium, iridium, aluminum, ruthenium, germanium, molybdenum, tungsten, antimony tin oxide, indium tin oxide (ITO), fluorine-doped zinc oxide, zinc, carbon, graphite, glassy carbon, a silver paste and a carbon paste, lithium, beryllium, sodium, magnesium, potassium, calcium, scandium, titanium, manganese, zirconium, gallium, niobium, a sodium-potassium alloy, a magnesium/copper mixture, a magnesium/silver mixture, a magnesium/aluminum mixture, a magnesium/indium mixture, an aluminum/aluminum oxide mixture, a lithium/aluminum mixture, etc. In the case of using such a material, the electrode can be formed by means of fabrication by a sputtering method or a vacuum vapor deposition method.

In the organic thin film transistor of the present invention, an electrode formed using a fluidic electrode material containing the foregoing conductive material, such as a solution, a paste, an ink, a dispersion, etc., can be utilized as the source electrode and the drain electrode. Also, for the purpose of suppressing damage to the organic semiconductor, it is preferable that the solvent or dispersion medium is a solvent or a dispersion medium each containing 60% by mass or more, and preferably 90% by mass or more of water. As a dispersion containing a metal fine particle, for example, a known conductive paste or the like may be used. In general, it is preferable that the dispersion is a dispersion containing a metal fine particle having a particle size of from 0.5 nm to 50 nm, and preferably from 1 nm to 10 nm. Examples of a material of this metal fine particle which can be used include platinum, gold, silver, nickel, chromium, copper, iron, tin, antimony-lead, tantalum, indium, palladium, tellurium, rhenium, iridium, aluminum, ruthenium, germanium, molybdenum, tungsten, zinc, etc.

It is preferable that an electrode is formed using a dispersion prepared by dispersing such a metal fine particle in water or a dispersion medium as an arbitrary organic solvent using a dispersion stabilizer composed mainly of an organic material. Examples of a method for manufacturing a dispersion of such a metal fine particle include a physical formation method such as a gas evaporation method, a sputtering method, a metal vapor synthesis method, etc.; and a chemical formation method for reducing a metal ion in a liquid phase to form a metal fine particle, such as a colloid method, a coprecipitation method, etc. Dispersions of a metal fine particle manufactured by a colloid method disclosed in JP-A-11-76800, JP-A-11-80647, JP-A-11-319538, JP-A-2000-239853, etc., or a gas evaporation method disclosed in JP-A-2001-254185, JP-A-2001-53028, JP-A-2001-35255, JP-A-2000-124157, JP-A-2000-123634, etc. are preferable.

The electrode is molded using such a metal fine particle dispersion; the solvent is dried; and thereafter, the molded article is heated in a desired shape at a temperature in the range of from 100° C. to 300° C., and preferably from 150° C. to 200° C. as the need arises, thereby thermally fusing the metal fine particle. There is thus formed an electrode pattern having a desired shape.

Furthermore, it is preferable that a known conductive polymer whose conductivity has been enhanced by means of doping or the like is used as each of the materials of the gate electrode, the source electrode and the drain electrode. For example, conductive polyanilines, conductive polypyrroles, conductive polythiophenes, a complex of polyethylene dioxythiophene (PEDOT) and polystyrene sulfonate and so on are also suitably used. These materials are able to reduce the contact resistance of each of the source electrode and the drain electrode with the organic semiconductor layer.

Among the foregoing examples, those materials having small electric resistance on the contact surface with the organic semiconductor layer are preferable with respect to the material for forming each of the source electrode and the drain electrode. On that occasion, when a current control device is prepared, the electric resistance is corresponding to the electric effect mobility, and it is necessary that the resistance is as small as possible for the purpose of obtaining a large mobility. In general, this is determined by a large and small relation between a work function of the electrode material and an energy level of the organic semiconductor layer.

When a work function (W) of the electrode material is defined as "a", an ionized potential (Ip) of the organic semiconductor layer is defined as "b", and an electron affinity (Af) of the organic semiconductor layer is defined as "c", it is preferable that they meet the following relational expression. Here, each of a, b and c is a positive value on the basis of vacuum level.

In the case of a p-type organic thin film transistor, (b−a) <1.5 eV (expression (I)) is preferable; and (b−a)<1.0 eV is more preferable. In the relation with the organic semiconductor layer, when the foregoing relation can be maintained, a device with high performance can be obtained. In particular, it is preferred to choose an electrode material having a large work function as far as possible. The work function is preferably 4.0 eV or more, and the work function is more preferably 4.2 eV or more.

A value of the work function of the metal may be selected from the list of effective metals having a work function of 4.0 eV or more, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). A metal having a high work function is mainly Ag (4.26, 4.52, 4.64, 4.74 eV), Al (4.06, 4.24, 4.41 eV), Au (5.1, 5.37, 5.47 eV), Be (4.98 eV), Bi (4.34 eV), Cd (4.08 eV), Co (5.0 eV), Cu (4.65 eV), Fe (4.5, 4.67, 4.81 eV), Ga (4.3 eV), Hg (4.4 eV), Ir (5.42, 5.76 eV), Mn (4.1 eV), Mo (4.53, 4.55, 4.95 eV), Nb (4.02, 4.36, 4.87 eV), Ni (5.04, 5.22, 5.35 eV), Os (5.93 eV), Pb (4.25 eV), Pt (5.64 eV), Pd (5.55 eV), Re (4.72 eV), Ru (4.71 eV), Sb (4.55, 4.7 eV), Sn (4.42 eV), Ta (4.0, 4.15, 4.8 eV), Ti (4.33 eV), V (4.3 eV), W (4.47, 4.63, 5.25 eV) or Zr (4.05 eV). Of these, noble metals (for example, Ag, Au, Cu or Pt), Ni, Co, Os, Fe, Ga, Ir, Mn, Mo, Pd, Re, Ru, V and W are preferable. Besides the metals, ITO, conductive polymers such as polyanilines and PEDOT:PSS, and carbon are preferable. Even when one or plural kinds of such a material having a high work function are included as the electrode material, so far as the work function meets the foregoing expression (I), there are no particular limitations.

In the case of an n-type organic thin film transistor, (a−c) <1.5 eV (expression (II)) is preferable; and (a−c)<1.0 eV is more preferable. In the relation with the organic semiconductor layer, when the foregoing relation can be maintained, a device with high performance can be obtained. In particular, it is preferred to choose an electrode material having a small work function as far as possible. The work function is preferably not more than 4.3 eV or more, and the work function is more preferably not more than 3.7 eV.

A value of the work function of the metal having a low work function may be selected from the list of effective metals having a work function of 4.3 eV or less, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). Examples thereof include Ag (4.26 eV), Al (4.06, 4.28 eV), Ba (2.52 eV), Ca (2.9 eV), Ce (2.9 eV), Cs (1.95 eV), Er (2.97 eV), Eu (2.5 eV), Gd (3.1 eV), Hf (3.9 eV), In (4.09 eV), K (2.28 eV), La (3.5 eV), Li (2.93 eV), Mg (3.66 eV), Na (2.36 eV), Nd (3.2 eV), Rb (4.25 eV), Sc (3.5 eV), Sm (2.7 eV), Ta (4.0, 4.15 eV), Y (3.1 eV), Yb (2.6 eV), Zn (3.63 eV), etc. Of these, Ba, Ca, Cs, Er, Eu, Gd, Hf, K, La, Li, Mg, Na, Nd, Rb, Y, Yb and Zn are preferable. Even when one or plural kinds of such a material having a low work function are included as the electrode material, so far as the work function meets the foregoing expression (II), there are no particular limitations. However, it is desirable that the metal having a low work function is covered by a metal which is stable in air, such as Ag and Au, as the need arises because when it comes into contact with moisture or oxygen in the air, it is easily deteriorated. The thickness necessary for covering is required to be 10 nm or more, and as the thickness becomes thick, the metal can be protected from oxygen or water. However, it is desirable that the thickness is not more than 1 μm for the reasons of practical use, an increase of productivity, etc.

With respect to a method for forming the electrode, the electrode is formed by a method, for example, vapor deposition, electron beam vapor deposition, sputtering, an atmospheric pressure plasma method, ion plating, chemical vapor phase vapor deposition, electrodeposition, electroless plating, spin coating, printing, inkjetting, etc. Also, with respect to a patterning method of a conductive thin film formed using the foregoing method, which is carried out as the need arises, there are a method for forming an electrode using a known photo lithographic method or a liftoff method; and a method of forming a resist by means of heat transfer, inkjetting, etc. onto a metal foil such as aluminum, copper, etc. and etching it. Also, a conductive polymer solution or dispersion, a metal fine particle-containing dispersion or the like may be subjected to patterning directly by an inkjetting method or may be formed from a coated film by means of lithography, laser abrasion, etc. Furthermore, a method for patterning a conductive ink, a conductive paste, etc. containing a conductive polymer or a metal fine particle by a printing method such as relief printing, intaglio printing, planographic printing, screen printing, etc. can be employed.

The thickness of the thus formed electrode is not particularly limited so far as the electrode is electrically conductive. It is preferably in the range of from 0.2 nm to 10 µm, and more preferably from 4 nm to 300 nm. When thickness of the electrode falls within this preferred range, the resistance is high because of the fact that the thickness is thin, whereby any voltage drop is not caused. Also, since the thickness is not excessively thick, it does not take a long period of time to form a film, and in the case of laminating other layers such as a protective layer, an organic semiconductor layer, etc., a laminated film can be smoothly formed without causing a difference in level.

Also, in the organic thin film transistor of the present embodiment, for example, for the purpose of enhancing injection efficiency, a buffer layer may be provided between the semiconductor layer and each of the source electrode and the drain electrode. With respect to the buffer layer, a compound having an alkali metal or alkaline earth metal ionic bond, which is used for a negative electrode of an organic EL device, such as LiF, $Li_2O$, CsF, $NaCO_3$, KCl, $MgF_2$, $CaCO_3$, etc., is desirable for the n-type organic thin film transistor. Also, a compound which is used as an electron injection layer or an electron transport layer in an organic EL device, such as Alq (tris(8-quinolinol)aluminum complex) may be inserted.

Cyano compounds such as $FeCl_3$, TCNQ, $F_4$-TCNQ, HAT, etc.; CFx; oxides of a metal other than alkali metals or alkaline earth metals, such as $GeO_2$, $SiO_2$, $MoO_3$, $V_2O_5$, $VO_2$, $V_2O_3$, MnO, $Mn_3O_4$, $ZrO_2$, $WO_3$, $TiO_2$, $In_2O_3$, ZnO, NiO, $HfO_2$, $Ta_2O_5$, $ReO_3$, $PbO_2$, etc.; and inorganic compounds such as ZnS, ZnSe, etc. are desirable for the p-type organic thin film transistor. In many cases, the most of these oxides cause oxygen deficiency, and this is suitable for hole injection. Furthermore, compounds which are used for a hole injection layer or a hole transport layer in an organic EL device, such as amine based compounds, for example, TPD (N,N'-bis(3-methylphenyl)-N,N'-diphenyl-(1,1'-biphenyl)-4,4'-dimaine), NPD (4,4'-bis[N-(1-naphthyl)-N-phenylamino]biphenyl), etc., CuPc (copper phthalocyanine), etc., may be used. Also, a combination of two or more kinds of the foregoing compounds is desirable.

It is known that the buffer layer decreases a threshold voltage upon lowering an injection barrier of a carrier, thereby bringing an effect for driving a transistor at a low voltage. We have found that the buffer layer brings not only the low voltage effect but an effect for enhancing the mobility with respect to the compound of the present invention. This is because a carrier trap exists at the interface between the organic semiconductor and the insulator layer; and when carrier injection is caused upon application of a gate voltage, the first injected carrier is used for burying the trap; however, when the buffer layer is inserted, the trap is buried at a low voltage, thereby enhancing the mobility. It would be better that the buffer layer exists thinly between the electrode and the organic semiconductor layer, and its thickness is from 0.1 nm to 30 nm, and preferably from 0.3 nm to 20 nm.

(Insulator Layer)

A material of the insulator layer in the organic thin film transistor of the present invention is not particularly limited so far as it is electrically insulative and can be formed as a thin film. Materials having an electric resistivity of 10 Ωcm or more at room temperature, such as metal oxides (including an oxide of silicon), metal nitrides (including a nitride of silicon), polymers, organic low-molecular weight compounds, etc., can be used; and inorganic oxide films having a high dielectric constant are especially preferable.

Examples of the inorganic oxide include silicon oxide, aluminum oxide, tantalum oxide, titanium oxide, tin oxide, vanadium oxide, barium strontium titanate, zirconic acid barium titanate, zirconic acid lead titanate, lanthanum lead titanate, strontium titanate, barium titanate, magnesium barium fluoride, lanthanum oxide, fluorine oxide, magnesium oxide, bismuth oxide, bismuth titanate, niobium oxide, bismuth strontium titanate, bismuth strontium tantalate, tantalum pentoxide, tantalic acid bismuth niobate, trioxide yttrium and combinations thereof, with silicon oxide, aluminum oxide, tantalum oxide and titanium oxide being preferable.

Also, inorganic nitrides such as silicon nitrides (for example, $Si_3N_4$ or $Si_xN_y$ (x, y>0)), aluminum nitride, etc. can be suitably used.

Furthermore, the insulator layer may be formed of a precursor including a metal alkoxide. For example, the insulator layer is formed by coating a solution of this precursor on, for example, a substrate and subjecting this to a chemical solution treatment including a heat treatment.

The metal of the foregoing metal alkoxide is selected from transition metals, lanthanoids and main group elements. Specific examples thereof include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), yttrium (Y), etc. Also, examples of the alkoxide in the foregoing metal alkoxide include those derived from alcohols, for example, methanol, ethanol, propanol, isopropanol, butanol, isobutanol, etc.; alkoxy alcohols, for example, methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, heptoxypropanol, etc.; and so on.

In the present invention, when the insulator layer is constituted of the foregoing material, polarization is easy to generate in the insulator layer, whereby the threshold voltage of the transistor operation can be reduced. Also, in particular, when the insulator layer is formed of a silicon nitride such as $Si_3N_4$, $Si_xN_y$, $SiON_x$ (x, y>0), etc. among the foregoing materials, a deletion layer more easily generates, whereby the threshold voltage of the transistor operation can be more reduced.

With respect to the insulator layer using an organic compound, polyimides, polyamides, polyesters, polyacrylates, photo radical polymerization based or photo cation polymerization based photocurable resins, copolymers containing an acrylonitrile component, polyvinyl phenol, polyvinyl alcohol, novolak resins, cyanoethyl pullulan, etc. can also be used.

Besides, polymer materials having a high dielectric constant, such as pullulan, etc., can be used in addition to waxes, polyethylene, polychloroprene, polyethylene terephthalate, polyoxymethylene, polyvinyl chloride, polyvinylidene fluoride, polysulfone, polyimide, cyanoethyl pullulan, poly (vinyl phenol) (PVP), poly(methyl methacrylate) (PMMA), polycarbonate (PC), polystyrene (PS), polyolefins, polyacrylamide, poly(acrylic acid), novolak resins, resol resins, polyimides, polyxylylene and epoxy resins.

With respect to the organic compound material or polymer material which is used in the insulator layer, organic compounds having water repellency are especially preferable. When the material has water repellency, an interaction between the insulator layer and the organic semiconductor layer is suppressed, and the crystallinity of the organic semiconductor layer is enhanced utilizing the cohesiveness which the organic semiconductor originally possesses, whereby the device performance can be enhanced. Examples thereof include polyparaxylylene derivatives described in *Jpn. J. Appl. Phys.*, Vol. 42 (2003), pages 6614 to 6618; and those described in Janos Veres, et al., *Chem. Mater.*, Vol. 16 (2004), pages 4543 to 4555.

Figure 4:
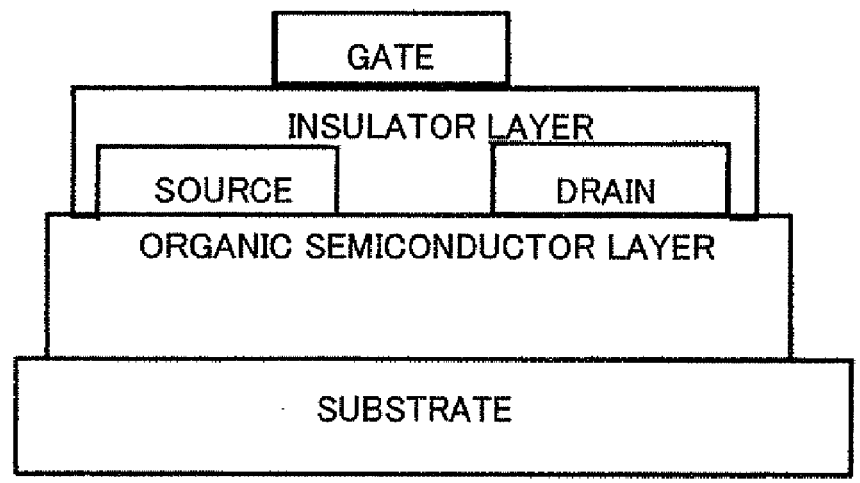
FIG. 4 is a view showing one embodiment of a device configuration of an organic thin film transistor of the present invention.

Also, when a top gate structure as shown in FIGS. 1 and 4 is used, by using such an organic compound as the material of the insulator layer, the fabrication can be carried out while minimizing the damage given to the organic semiconductor layer, and therefore, such is an effective method.

The foregoing insulator layer may be a mixed layer using the plural of the foregoing inorganic or organic compound materials or may be of a laminated structure thereof. In that case, the performance of the device can be controlled by mixing a material having a high dielectric constant and a material having water repellency or laminating the both as the need arises.

Also, the insulator layer may be an anodic oxide film or may include the anodic oxide film as a constituent. It is preferable that the anodic oxide film is subjected to a sealing treatment. The anodic oxide film is formed by anodically oxidizing an anodic oxidizable metal by a known method. Examples of the anodic oxidizable metal include aluminum and tantalum. The method of the anodic oxidation treatment is not particularly limited, and known methods can be employed. By carrying out the anodic oxidation treatment, an oxide film is formed. As an electrolytic solution which is used for the anodic oxidation treatment, any material can be used so far as it is able to form a porous oxide film. In general, sulfuric acid, phosphoric acid, oxalic acid, chromic acid, boric acid, sulfamic acid, benzenesulfonic acid, etc., or mixed acids composed of a combination of two or more kinds of those acids or salts thereof are useful. The treatment condition of the anodic oxidation variously varies depending upon the electrolytic solution to be used and cannot be unequivocally specified. However, in general, it is appropriate that the concentration of the electrolytic solution is in the range of from 1 to 80% by mass; that the temperature of the electrolytic solution is in the range of from 5 to 70° C.; that the current density is in the range of from 0.5 to 60 A/cm$^2$; that the voltage is in the range of from 1 to 100 volts; and that the electrolysis time is in the range of from 10 seconds to 5 minutes. A preferred anodic oxidation treatment is a method for carrying out the treatment with a direct current using, as the electrolytic solution, an aqueous solution of sulfuric acid, phosphoric acid or boric acid; however, an alternating current can also be applied. The concentration of such an acid is preferably from 5 to 45% by mass; and it is preferable that the electrolysis treatment is carried out at a temperature of the electrolytic solution of from 20 to 50° C. and a current density of from 0.5 to 20 A/cm$^2$ for from 20 to 250 seconds.

With respect to the thickness of the insulator layer, when the thickness of the layer is thin, an effective voltage which is applied to the organic semiconductor becomes large, and therefore, it is possible to lower a driving voltage and a threshold voltage of the device itself. However, on the contrary, a leak current between the source and the gate becomes large. Therefore, it is necessary to select an appropriate thickness of the film. The thickness of the film is usually from 10 nm to 5 μm, preferably from 50 nm to 2 μm, and more preferably from 100 nm to 1 μm.

Also, an arbitrary orientation treatment may be applied between the insulator layer and the organic semiconductor layer. A preferred embodiment thereof is a method in which a water repelling treatment or the like is applied onto the surface of the insulator layer, thereby reducing an interaction between the insulator layer and the organic semiconductor layer and enhancing the crystallinity of the organic semiconductor layer. Specifically, there is exemplified a method in which a silane coupling agent, for example, materials of self-assembled oriented film such as octadecyltrichlorosilane, trichloromethylsilazane, alkane phosphoric acids, alkane sulfonic acids, alkane carboxylic acids, etc., is brought into contact with the surface of an insulating film in a liquid phase or vapor phase state, thereby forming a self-assembled monolayer, which is then properly dried. Also, as used in the orientation of a liquid crystal, a method of disposing a film constituted of a polyimide or the like on the surface of an insulating film and subjecting the resulting surface to a rubbing treatment is also preferable.

Examples of the method for forming the insulator layer include dry processes such as a vacuum vapor deposition method, a molecular beam epitaxial growth method, an ion cluster beam method, a low energy ion beam method, an ion plating method, a CVD method, a sputtering method, an atmospheric pressure plasma method disclosed in JP-A-11-61406, JP-A-11-133205, JP-A-2000-121804, JP-A-2000-147209 and JP-A-2000-185362, etc.; and wet processes such as methods by coating, for example, a spray coating method, a spin coating method, a blade coating method, a dip coating method, a casting method, a roller coating method, a bar coating method, a die coating method, etc., and methods by patterning, for example, printing, inkjetting, etc. They can be applied depending upon the material. As the wet process, a method of coating and drying a solution prepared by dispersing a fine particle of an inorganic oxide in an arbitrary organic solvent or water and optionally, a dispersing agent such as surfactants, etc.; and a so-called sol-gel method of coating and drying a solution of an oxide precursor, for example, an alkoxide are useful.

Though the thickness of the organic semiconductor layer in the organic thin film transistor of the present invention is not particularly limited, it is usually from 0.5 nm to 1 μm, and preferably from 2 nm to 250 nm.

Also, a method for forming the organic semiconductor layer is not particularly limited, and a known method is employable. For example, the organic semiconductor layer is formed from the foregoing materials of the organic semiconductor layer by a molecular beam epitaxy method (MBE method), a vacuum vapor deposition method, chemical vapor deposition, a printing or coating method of a solution having a material dissolved in a solvent, such as a dipping method, a spin coating method, a casting method, a bar coating method, a roller coating method, etc., baking, electro-polymerization, molecular beam vapor deposition, self-assembling from a solution, or a method of a combination of those methods.

When the crystallinity of the organic semiconductor layer is enhanced, the field effect mobility is enhanced. Therefore, in the case of employing fabrication (for example, vapor deposition, sputtering, etc.) from a vapor phase, it is desirable to keep the temperature of the substrate during the fabrication at a high temperature. The temperature is preferably from 50 to 250° C., and more preferably from 70 to 150° C. Also, regardless of the fabrication method, it is preferable that annealing is carried out after the fabrication because a high-performance device is obtained. With respect to the annealing, the temperature is preferably from 50 to 200° C., and more preferably from 70 to 200° C.; and the time is preferably from 10 minutes to 12 hours, and more preferably from 1 to 10 hours.

In the present invention, one kind of materials selected from the general formulae (1) to (5) may be used in the organic semiconductor layer. The plural of these materials may be combined or used as plural mixed thin films or laminated using a known semiconductor such as a pentacene or a thiophene oligomer, etc.

A method for forming the organic thin film transistor of the present invention is not particularly limited but may be carried out in accordance with a known method. It is preferable that the formation is carried out in accordance with a desired device configuration through a series of device preparation steps including charging a substrate, forming a gate electrode, forming an insulator layer, forming an organic semiconductor layer, forming a source electrode and forming a drain electrode without utterly coming into contact with the air because the hindrance of a device performance to be caused due to the moisture or oxygen or the like in the air upon contact with the air can be prevented. When it is unable to evade the contact with the air once, it is preferable that steps after the fabrication of the organic semiconductor layer are a step of not contacting with the air at all; and that immediately before the fabrication of the organic semiconductor layer, the surface on which the organic semiconductor layer is laminated (for example, in the case of the device B, the surface of the insulating layer on which are partially laminated the source electrode and the drain electrode) is cleaned and activated by means of irradiation with ultraviolet rays, irradiation with ultraviolet rays/ozone, oxygen plasma, argon plasma, etc., and the organic semiconductor layer is then laminated.

Furthermore, for example, taking into consideration influences of oxygen, water, etc. contained in the air against the organic semiconductor layer, a gas barrier layer may be formed entirely or partially on the peripheral surface of the organic transistor device. As a material for forming the gas barrier layer, those which are commonly used in this field can be used, and examples thereof include polyvinyl alcohol, an ethylene-vinyl alcohol copolymer, polyvinyl chloride, polyvinylidene chloride, polychlorotrifluoroethylene, etc. Furthermore, the inorganic materials having insulating properties, which are exemplified in the foregoing insulator layer, can be used.

The present invention provides an organic thin film light emitting transistor in which in the foregoing organic thin film transistor, light emission is obtained utilizing a current flowing between a source and a drain, and the light emission is controlled upon application of a voltage to a gate electrode.

The organic thin film transistor in the present invention can also be used as a light emitting device using charges injected from the source and drain electrodes. That is, the organic thin film transistor can be used as an organic thin film light emitting transistor also having a function as a light emitting device (organic EL device). This is able to control the emission intensity by controlling a current flowing between the source and drain electrodes by the gate electrode. Since the transistor for controlling the emission and the light emitting device can be consolidated, the costs can be reduced due to an enhancement of the degree of opening of a display or simplification of the preparation process, resulting in great advantages from the standpoint of practical use. When used as an organic light emitting transistor, the contents which have been described previously in detail are sufficient. However, in order to make the organic thin film transistor of the present invention operate as an organic light emitting transistor, it is necessary to inject holes from one of a source and a drain and to inject electrons from the other; and in order to enhance the emission performance, it is preferable that the following condition is met.

(Source and Drain)

With respect to the organic thin film light emitting transistor of the present invention, in order to enhance the injection properties of holes, it is preferable that at least one of the electrodes is a hole injection electrode. The hole injection electrode as referred to herein is an electrode including a material having the foregoing work function of 4.2 eV or more.

Also, in order to enhance the injection properties of electrons, it is preferable that at least one of the electrodes is an electron injection electrode. The electron injection electrode as referred to herein is an electrode including a material having the foregoing work function of not more than 4.3 eV. An organic thin film light emitting transistor provided with electrodes such that one of the electrodes has hole injection properties, with the other having electron injection properties, is more preferable.

(Device Configuration)

With respect to the organic thin film light emitting transistor of the present invention, for the purpose of enhancing the hole injection properties, it is preferable that a hole injection layer is inserted between at least one of the electrodes and the organic semiconductor layer. With respect to the hole injection layer, amine based materials which are used as a hole injection material or a hole transport material in organic EL devices and so on are useful.

Also, for the purpose of enhancing the electron injection properties, it is preferable that an electron injection layer is inserted between at least one of the electrodes and the organic semiconductor layer. Similar to the hole injection layer, electron injection materials which are used in organic EL devices and so on are useful.

An organic thin film light emitting transistor in which a hole injection layer is provided beneath at least one of the electrodes, and an electron injection layer is provided beneath the other electrode is more preferable.

Also, in the organic thin film light emitting transistor of the present embodiment, for example, for the purpose of enhancing injection efficiency, a buffer layer may be provided between the semiconductor layer and each of the source electrode and the drain electrode.

EXAMPLES

Next, the present invention is described in more detail with reference to the following Examples.

Synthesis Example 1

Synthesis of Compound (1)

The foregoing Compound (1) was synthesized in the following manner. A synthesis route is described below.

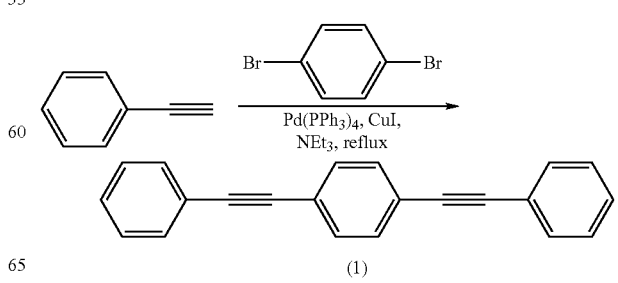

A 300-mL three-necked flask was charged with 7.50 g (31.7 mmoles) of 1,4-dibromobenzene, 1.83 g (1.59 mmoles) of tetrakistriphenylphosphine palladium and 0.604 g (3.17 mmoles) of copper(I) iodide and then purged with argon. 150 mL of triethylamine and 10.5 mL (95.4 mmoles) of ethynylbenzene were added thereto, and the mixture was refluxed under heating for 9 hours in an argon atmosphere. 100 mL of water and 100 mL of methylene chloride were added to the reaction solution, and an organic layer was separated and dried over anhydrous magnesium sulfate. After concentration in vacuo by an evaporator, the obtained solid was purified by silica gel column chromatography (eluent: methylene chloride/hexane=1/10), thereby obtaining 2.55 g (9.16 mmoles, yield: 29%) of Compound (1). The present compound was confirmed to be a desired compound by the measurement of 90 MHz $^1$H-NMR and FD-MS (field desorption mass analysis). The measurement results of FD-MS are shown below. FD-MS, calculated for $C_{48}H_{30}S_2$=278, found, m/z=278 ($M^+$, 100)

Also, the present compound was subjected to sublimation purification at 220° C. Compound (1) obtained by the sublimation purification had a purity of 99.5%.

The apparatus and measurement condition of FD-MS (field desorption mass analysis) in Synthesis Example 1 are as follows.
<FD-MS Measurement>
Apparatus:
 HX110 (manufactured by JEOL Ltd.)
Condition:
 Accelerating voltage: 8 kV
 Scan range: m/z=50 to 1,500

Example 1

Manufacture of Organic Thin Film Transistor

An organic thin film transistor was prepared according to the following procedures. First of all, the surface of an Si substrate (p-type also serving as a gate electrode, specific resistivity: 1 Ωcm) was oxidized by a thermal oxidation method to prepare a 300 nm-thick thermally oxidized film on the substrate, which was then used as an insulator layer. Furthermore, after completely removing the $SiO_2$ film fabricated on one surface of the substrate by means of dry etching, chromium was fabricated in a thickness of 20 nm thereon by a sputtering method; and gold (Au) was further fabricated in a thickness of 100 nm thereon by means of sputtering, thereby forming a lead-out electrode. This substrate was ultrasonically cleaned with a neutral detergent, pure water, acetone and ethanol each for 30 minutes, followed by further cleaning with ozone.

Figure 7:
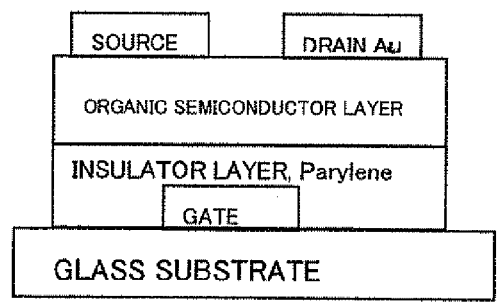
FIG. 7 is a view showing one embodiment of a device configuration of an organic thin film transistor in the Examples of the present invention.

Next, the foregoing substrate was placed in a vacuum vapor deposition apparatus (EX-400, manufactured by ULVAC, Inc.), and the foregoing Compound (2) which had been synthesized in the same manner as in Synthesis Example 1, except for using ethynyltoluene in place of the ethynylbenzene as used, was fabricated in a thickness of 50 nm as an organic semiconductor layer on the insulator layer at a vapor deposition rate of 0.05 nm/s. Subsequently, gold was fabricated in a thickness of 50 nm through a metal mask, thereby forming a source electrode and a drain electrode which did not come into contact with each other at a space (channel length L) of 75 µm. At that time, the fabrication was carried out such that a width (channel width W) between the source electrode and the drain electrode was 5 mm, thereby preparing an organic thin film transistor (see FIG. 7).

A gate voltage of −40 V was applied to the gate electrode of the obtained organic thin film transistor, and a voltage was applied between the source and the drain, thereby flowing a current. In that case, electrons are induced in a channel region (between the source and the drain) of the organic semiconductor layer, whereby the organic thin film transistor works as a p-type transistor. As a result, an ON/OFF ratio of the current between the source and drain electrodes in a current saturation region was $3\times10^5$. Also, an electric field effect mobility µ of the hole was calculated in accordance with the following expression (A) and found to be $3\times10^{-2}$ cm$^2$/Vs.

$$I_D=(W/2L)\cdot C\mu\cdot(V_G-V_T)^2 \quad (A)$$

In the expression, $I_D$ represents a current between the source and the drain; W represents a channel width; L represents a channel length; C represents an electric capacitance per unit area of the gate insulator layer; $V_T$ represents a gate threshold voltage; and $V_G$ represents a gate voltage.

Examples 2 to 7

Manufacture of Organic Thin Film Transistors

Organic thin film transistors were prepared in the same manner as in Example 1, except for using each of the compounds shown in Table 1 as the material of the organic semiconductor layer in place of the Compound (2). The obtained organic thin film transistors were each subjected to p-type driving at a gate voltage $V_G$ of −40 V in the same manner as in Example 1. ON/OFF ratios of the current between the source and drain electrodes were measured, and field effect mobilities µ of the hole were calculated. The results are shown in Table 1.

Example 8

Manufacture of Organic Thin Film Transistor

An organic semiconductor layer was fabricated in the same manner as in Example 1, except for using Compound (110) as the material of the organic semiconductor layer in place of the Compound (2). Subsequently, Ca was vacuum vapor deposited in a thickness of 20 nm as the source and drain electrodes through the metal mask in place of Au at a vapor deposition rate of 0.05 nm/s. Thereafter, Ag was vapor deposited at a vapor deposition rate of 0.05 nm/s, thereby coating Ca. There was thus prepared an organic thin film transistor. The obtained organic thin film transistor was subjected to n-type driving at a gate voltage $V_G$ of +40 V. An ON/OFF ratio of the current between the source and drain electrodes was measured, and a field effect mobility µ of the electron was calculated. The results are shown in Table 1.

Example 9

Manufacture of Organic Thin Film Transistor

An organic thin film transistor was prepared in the same manner as in Example 8, except for using Compound (44) as the material of the organic semiconductor layer in place of the Compound (110). The obtained organic thin film transistor was subjected to n-type driving at a gate voltage $V_G$ of +40 V in the same manner as in Example 8. An ON/OFF ratio of the current between the source and drain electrodes was measured, and a field effect mobility μ of the electron was calculated. The results are shown in Table 1.

Example 10

Manufacture of Organic Thin Film Transistor

An organic thin film transistor was prepared in the same manner as in Example 6, except for vacuum vapor depositing a buffer layer $MoO_3$ in a thickness of 10 nm as the source and drain electrodes in place of Au singly at a vapor deposition rate 0.05 nm/s, thereby inserting it between Au and the thin film of Compound (61). The obtained organic thin film transistor was subjected to p-type driving at a gate voltage $V_G$ of −40 V in the same manner as in Example 1. An ON/OFF ratio of the current between the source and drain electrodes was measured, and a field effect mobility μ of the hole was calculated. The results are shown in Table 1.

Example 11

Manufacture of Organic Thin Film Transistor

First of all, a glass substrate was ultrasonically cleaned with a neutral detergent, pure water, acetone and ethanol each for 30 minutes, and gold (Au) was then fabricated in a thickness of 40 nm thereon by a sputtering method, thereby preparing a gate electrode. Subsequently, this substrate was set in a fabrication zone of a thermal CVD apparatus. On the other hand, 250 mg of a polyparaxylene derivative [polyparaxylene chloride (Parylene)] (a trade name: diX-C, manufactured by Daisan Kasei Co., Ltd.) as a raw material of the insulator layer is charged in a Petri dish and placed in an evaporation zone of the raw material. The thermal CVD apparatus was evacuated by a vacuum pump; and after the pressure reached 5 Pa, the evaporation zone and the polymerization zone were heated up to 180° C. and 680° C., respectively and allowed to stand for 2 hours, thereby forming an insulator layer having a thickness of 1 μm on the gate electrode.

Next, the substrate was placed in a vacuum vapor deposition apparatus (EX-400, manufactured by ULVAC, Inc.), and Compound (60) was fabricated in a thickness of 50 nm as an organic semiconductor layer on the insulator layer at a vapor deposition rate of 0.05 nm/s. Subsequently, gold was fabricated in a thickness of 50 nm through a metal mask, thereby forming a source electrode and a drain electrode which did not come into contact with each other at a space (channel length L) of 75 μm. At that time, the fabrication was carried out such that a width (channel width W) between the source electrode and the drain electrode was 5 mm, thereby preparing an organic thin film transistor (see FIG. 7).

The obtained organic thin film transistor was subjected to p-type driving upon application of a gate voltage $V_G$ of −40 V to the gate electrode in the same manner as in Example 1. An ON/OFF ratio of the current between the source and drain electrodes was measured, and a field effect mobility μ of the hole was calculated. The results are shown in Table 1.

Example 12

Manufacture of Organic Thin Film Transistor

An organic thin film transistor was prepared in the same manner as in Example 11, except for using Compound (61) as the material of the organic semiconductor layer in place of the Compound (60). The obtained organic thin film transistor was subjected to p-type driving at a gate voltage $V_G$ of −40 V in the same manner as in Example 1. An ON/OFF ratio of the current between the source and drain electrodes was measured, and a field effect mobility μ of the hole was calculated. The results are shown in Table 1.

Example 13

Manufacture of Organic Thin Film Transistor

An organic thin film transistor was prepared in the same manner as in Example 11, except for using Compound (44) as the material of the organic semiconductor layer in place of the Compound (60). The obtained organic thin film transistor was subjected to n-type driving at a gate voltage $V_G$ of +40 V in the same manner as in Example 8. An ON/OFF ratio of the current between the source and drain electrodes was measured, and a field effect mobility μ of the electron was calculated. The results are shown in Table 1.

Example 14

Manufacture of Organic Thin Film Transistor

An organic thin film transistor was prepared in the same manner as in Example 11, except for using Compound (65) as the material of the organic semiconductor layer in place of the Compound (60). The obtained organic thin film transistor was subjected to n-type driving at a gate voltage $V_G$ of +40 V in the same manner as in Example 8. An ON/OFF ratio of the current between the source and drain electrodes was measured, and a field effect mobility μ of the electron was calculated. The results are shown in Table 1.

Example 15

Manufacture of Organic Thin Film Transistor

Cleaning of a substrate, fabrication of a gate electrode and fabrication of an insulator layer were carried out in the same manner as in Example 11. Subsequently, 0.5% by weight of Compound (175) was dissolved in chloroform, and the solution was fabricated on the substrate which had been fabricated up to the foregoing insulating layer by a spin coater (1H-D7, manufactured by Mikasa Co., Ltd.) and dried at 80° C. in a nitrogen atmosphere, thereby fabricating it as an organic semiconductor layer. Subsequently, gold (Au) was fabricated in a thickness of 50 nm through a metal mask, thereby forming the source and drain electrodes which did not come into contact with each other. There was thus prepared an organic thin film transistor.

The obtained organic thin film transistor was subjected to p-type driving at a gate voltage $V_G$ of −40 V in the same manner as in Example 1. An ON/OFF ratio of the current between the source and drain electrodes was measured, and a field effect mobility μ of the hole was calculated. The results are shown in Table 1.

Comparative Example 1

Manufacture of Organic Thin Film Transistor

Cleaning of a substrate, fabrication of a gate electrode and formation of an insulator layer were carried out in the same manner as in Example 1. Subsequently, 3% by mass of polyparaphenylene vinylene (PPV) [molecular weight (Mn):86, 000, molecular weight distribution (Mw/Mn)=5.1] was dissolved in toluene, and the solution was fabricated on the substrate which had been fabricated up to the foregoing insulating layer by a spin coating method and dried at 120° C. in a nitrogen atmosphere, thereby fabricating it as an organic semiconductor layer. Subsequently, gold (Au) was fabricated in a thickness of 50 nm through a metal mask, thereby forming the source and drain electrodes which did not come into contact with each other. There was thus prepared an organic thin film transistor.

The obtained organic thin film transistor was subjected to p-type driving at a gate voltage $V_G$ of −40 V in the same manner as in Example 1. An ON/OFF ratio of the current between the source and drain electrodes was measured, and a field effect mobility μ of the hole was calculated. The results are shown in Table 1.

Comparative Example 2

Manufacture of Organic Thin Film Transistor

Fabrication up to the organic semiconductor layer was carried out in exactly the same manner as in Comparative Example 1 using polyparaphenylene vinylene (PPV) as the material of the organic semiconductor layer. Thereafter, Ca was fabricated as the source and drain electrodes through a metal mask in the same manner as in Example 8, and Ag was then coated thereon, thereby preparing an organic thin film transistor.

The obtained organic thin film transistor was subjected to n-type driving at a gate voltage $V_G$ of +40 V in the same manner as in Example 8. An ON/OFF ratio of the current between the source and drain electrodes was measured, and a field effect mobility μ of the electron was calculated. The results are shown in Table 1.

TABLE 1

| Kind of compound of organic semiconductor layer | Kind of transistor | Field effect mobility (cm²/Vs) | ON/OFF ratio |
|---|---|---|---|
| Example 1 | (2) | p-Type | $3 \times 10^{-2}$ | $3 \times 10^5$ |
| Example 2 | (42) | p-Type | $6 \times 10^{-2}$ | $8 \times 10^5$ |
| Example 3 | (9) | p-Type | $5 \times 10^{-3}$ | $2 \times 10^5$ |
| Example 4 | (43) | p-Type | $8 \times 10^{-3}$ | $8 \times 10^4$ |
| Example 5 | (60) | p-Type | $5 \times 10^{-1}$ | $5 \times 10^6$ |
| Example 6 | (61) | p-Type | $2 \times 10^{-1}$ | $2 \times 10^5$ |
| Example 7 | (162) | p-Type | $6 \times 10^{-3}$ | $8 \times 10^2$ |
| Example 8 | (110) | n-Type | $2 \times 10^{-3}$ | $2 \times 10^4$ |
| Example 9 | (44) | n-Type | $1 \times 10^{-3}$ | $2 \times 10^3$ |
| Example 10 | (61) | p-Type | $7 \times 10^{-1}$ | $1 \times 10^5$ |
| Example 11 | (60) | p-Type | $9 \times 10^{-1}$ | $1 \times 10^6$ |
| Example 12 | (61) | p-Type | $4 \times 10^{-1}$ | $3 \times 10^5$ |
| Example 13 | (44) | n-Type | $8 \times 10^{-3}$ | $7 \times 10^2$ |
| Example 14 | (65) | n-Type | $2 \times 10^{-3}$ | $8 \times 10^2$ |
| Example 15 | (175) | p-Type | $7 \times 10^{-2}$ | $2 \times 10^5$ |
| Comparative Example 1 | PPV | p-Type | $1 \times 10^{-5}$ | $1 \times 10^3$ |
| Comparative Example 2 | PPV | n-Type | $1 \times 10^{-4}$ | $1 \times 10^3$ |

Example 16

Manufacture of Organic Thin Film Transistor

An organic thin film light emitting transistor was prepared according to the following procedures. First of all, the surface of an Si substrate (p-type also serving as a gate electrode, specific resistivity: 1 Ωcm) was oxidized by a thermal oxidation method to prepare a 300 nm-thick thermally oxidized film on the substrate, which was then used as an insulator layer. Furthermore, after completely removing the SiO₂ film fabricated on one surface of the substrate by means of dry etching, chromium was fabricated in a thickness of 20 nm thereon by a sputtering method; and gold (Au) was further fabricated in a thickness of 100 nm thereon by means of sputtering, thereby forming a lead-out electrode. This substrate was ultrasonically cleaned with a neutral detergent, pure water, acetone and ethanol each for 30 minutes.

Figure 9:
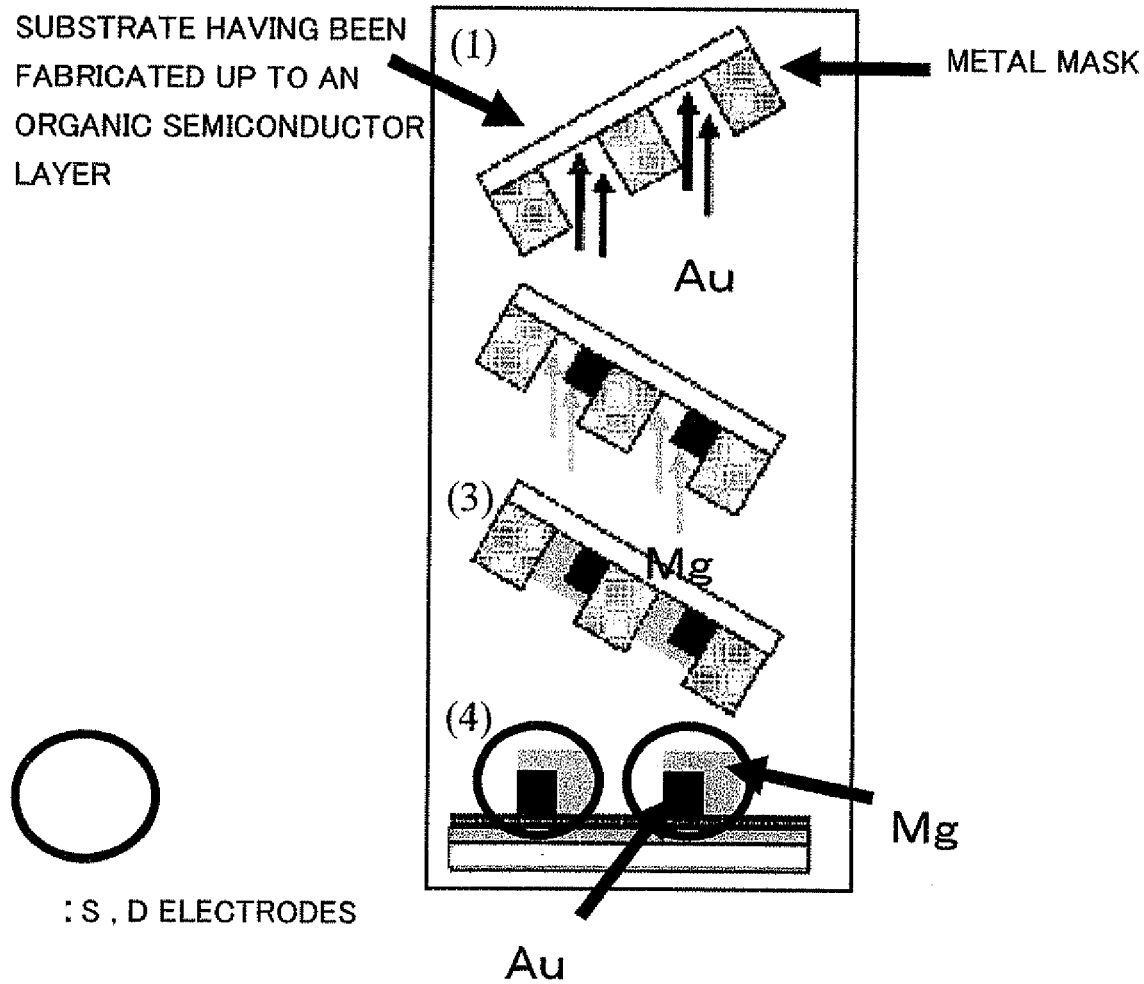
FIG. 9 is a view showing one embodiment of a device configuration of an organic thin film light emitting transistor in the Examples of the present invention.

Next, the foregoing substrate was placed in a vacuum vapor deposition apparatus (EX-900, manufactured by ULVAC, Inc.), and the foregoing Compound (2) was fabricated in a thickness of 100 nm as an organic semiconductor light emitting layer on the insulator layer (SiO₂) at a vapor deposition rate of 0.05 nm/s. Subsequently, a metal mask having a channel length of 75 μm and a channel width 5 mm was placed in the same manner as described previously, and gold was fabricated in a thickness of 50 nm through the mask in a state of inclining the substrate at 45° against an evaporation source. Subsequently, Mg was vapor deposited in a thickness of 100 nm in a state of inclining the substrate at 45° in the reverse direction, thereby preparing an organic thin film light emitting transistor in which a source electrode and a drain electrode which did not come into contact with each other were each substantially provided with a hole injection electrode (Au) and an electron transport electrode (Mg) (see FIG. 9).

Figure 10:
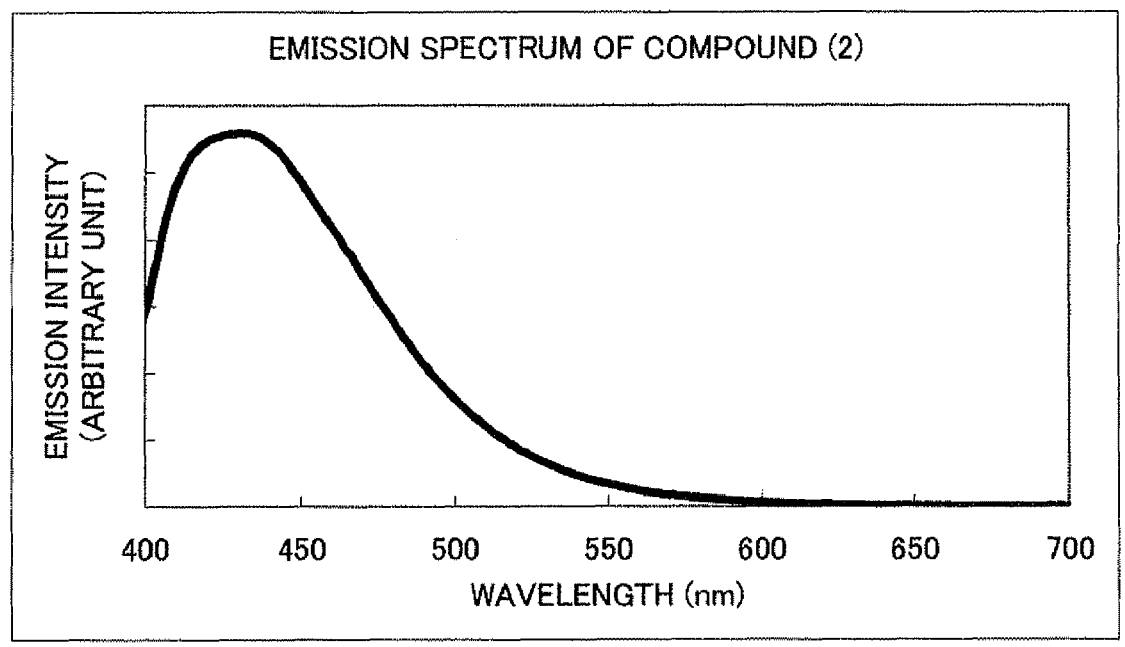
FIG. 10 is a graph showing an emission spectrum of an organic thin film light emitting transistor in the Examples of the present invention.

When −100 V was applied between the source and drain electrodes, and −100 V was applied to the gate electrode, blue emission of 50 cd/m² was obtained. An emission spectrum is shown in FIG. 10.

[Industrial Applicability]

As described above in detail, by using a compound having a specified structure with high electron mobility as a material of an organic semiconductor layer, the organic thin film transistor of the present invention has a fast response speed (driving speed), has a large ON/OFF ratio and is high in performance as a transistor; and it is also able to be utilized as an organic thin film light emitting transistor which can achieve light emission.

The invention claimed is:

1. An organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound represented by the following formula (1):

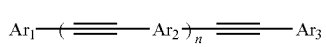
(1)

in the formula (1), Ar₁ is represented by the following formula (2); and Ar₃ is represented by the following formula (3):

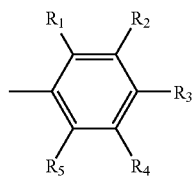
(2)

-continued

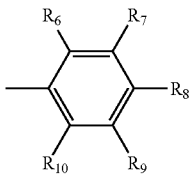

(3)

in the formulae (2) and (3), $R_1$ to $R_{10}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group; and each of these groups may have a substituent, $R_1$ to $R_5$ and $R_6$ to $R_{10}$ may each form a saturated or unsaturated cyclic structure together with an adjacent group thereto, Ar$_2$ represents an optionally substituted condensed polycyclic aromatic hydrocarbon group having from 10 to 60 carbon atoms or an optionally substituted aromatic heterocyclic group having from 1 to 60 carbon atoms, and n represents an integer of from 1 to 20.

2. The organic thin film transistor according to claim 1, wherein in the formula (1), Ar$_2$ represents an optionally substituted condensed polycyclic aromatic hydrocarbon group having from 10 to 60 carbon atoms.

3. The organic thin film transistor according to claim 1, wherein in the formula (1), Ar$_2$ represents an optionally substituted divalent residue of naphthalene, anthracene, phenanthracene, tetracene, chrysene or pentacene.

4. The organic thin film transistor according to claim 1, wherein in the formula (1), Ar$_2$ represents an optionally substituted condensed polycyclic aromatic heterocyclic ring having from 6 to 60 carbon atoms.

5. The organic thin film transistor according to claim 1, wherein in the general formula (1), Ar$_2$ represents an optionally substituted divalent residue of pyrrole, pyridine, pyrimidine, imidazole, thiazole, dithienobenzene, benzothiadiazole, quinoline, benzothiophene, dibenzothiophene, benzofuran or dibenzofuran.

6. The organic thin film transistor according to claim 1, wherein in the formula (1), n is 1.

7. The organic thin film transistor according to claim 1, wherein in the formulae (2) and (3), all of $R_1$, $R_2$, $R_4$, $R_5$, $R_6$, $R_7$, $R_9$ and $R_{10}$ are a hydrogen atom; and at least one of $R_3$ and $R_8$ is a halogen atom, an alkyl group having from 1 to 8 carbon atoms, a haloalkyl group having from 1 to 8 carbon atoms, a haloalkoxyl group having from 1 to 8 carbon atoms, an alkylamino group having from 1 to 8 carbon atoms or a dialkylamino group having from 2 to 16 carbon atoms (the alkyl groups may be bonded to each other to form a nitrogen atom-containing cyclic structure), and when at least one of $R_3$ and $R_8$ is not a halogen atom, an alkyl group, a haloalkyl group, a haloalkoxyl group, an alkylamino group or a dialkylamino group, then it is a hydrogen atom.

8. The organic thin film transistor according to claim 1, wherein the compound represented by the formula (1) is a compound represented by the following formula (4):

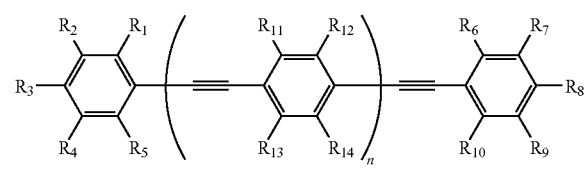

(4)

in the formula (4), $R_1$ to $R_{14}$ each represents the same group as in $R_1$ to $R_{10}$;

$R_1$ to $R_5$, $R_6$ to $R_{10}$, $R_{11}$ to $R_{12}$ and $R_{13}$ to $R_{14}$ may each form a saturated or unsaturated cyclic structure together with an adjacent group thereto; and n is the same as described above.

9. The organic thin film transistor according to claim 8, wherein in the formula (4), $R_{11}$ to $R_{14}$ each independently represents a hydrogen atom, a halogen atom, an alkyl group having from 1 to 8 carbon atoms, a haloalkyl group having from 1 to 8 carbon atoms, an alkoxyl group having from 1 to 8 carbon atoms, an alkylthio group having from 1 to 8 carbon atoms, an alkylamino group having from 1 to 8 carbon atoms, a dialkylamino group having from 2 to 8 carbon atoms (the alkyl groups may be bonded to each other to form a nitrogen atom-containing cyclic structure), an alkylsulfonyl group having from 1 to 8 carbon atoms or a cyano group.

10. The organic thin film transistor according to claim 8, wherein in the formula (4), all of $R_1$, $R_2$, $R_4$, $R_5$, $R_6$, $R_7$ and $R_9$ to $R_{14}$ are a hydrogen atom; and at least one of $R_3$ and $R_8$ is a halogen atom, an alkyl group having from 1 to 8 carbon atoms, a haloalkyl group having from 1 to 8 carbon atoms, a haloalkoxyl group having from 1 to 8 carbon atoms, an alkylamino group having from 1 to 8 carbon atoms or a dialkylamino group having from 2 to 16 carbon atoms (the alkyl groups may be bonded to each other to form a nitrogen atom-containing cyclic structure), and when at least one of $R_3$ and $R_8$ is not a halogen atom, an alkyl group, a haloalkyl group, a haloalkoxyl group, an alkylamino group or a dialkylamino group, then it is a hydrogen atom.

11. The organic thin film transistor according to claim 8, wherein in the formula (4), any one of $R_1$ to $R_{14}$ is a fluorine atom, a cyano group, a trifluoromethyl group or a pentafluoroethyl group.

12. The organic thin film transistor according to claim 8, wherein in the formula (4), n is 1.

13. The organic thin film transistor according to claim 8, wherein in the formula (4), n represents an integer of 2 or more.

14. The organic thin film transistor according to claim 1, comprising a buffer layer between each of the source and drain electrodes and the organic semiconductor layer.

15. An organic thin film light emitting transistor, wherein in the organic thin film transistor according to claim 1, light emission is obtained utilizing a current flowing between the source and the drain, and the light emission is controlled upon application of a voltage to the gate electrode.

16. The organic thin film light emitting transistor according to claim 15, wherein at least one of the source and the drain is composed of a material having a work function of 4.2 eV, and/or at least one of them is composed of a material having a work function of not more than 4.3 eV.

17. The organic thin film light emitting transistor according to claim 15, comprising a buffer layer between each of the source and drain electrode and the organic semiconductor layer.

18. An organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound represented by the following formula (1):

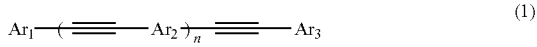

(1)

in the formula (1), Ar$_1$ is represented by the following formula (2); and Ar$_3$ is represented by the following formula (3):

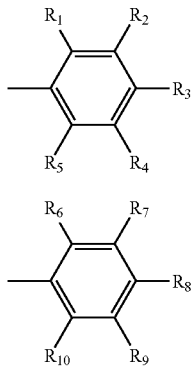

(2)

(3)

in the formulae (2) and (3), R$_1$ to R$_{10}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group; and each of these groups may have a substituent, R$_1$ to R$_5$ and R$_6$ to R$_{10}$ may each form a saturated or unsaturated cyclic structure together with an adjacent group thereto, Ar$_2$ represents an optionally substituted aromatic hydrocarbon group having from 6 to 60 carbon atoms or an optionally substituted aromatic heterocyclic group having from 1 to 60 carbon atoms, and n represents an integer of 2 to 20.

19. An organic thin film transistor comprising a substrate having thereon at least three terminals of a gate electrode, a source electrode and a drain electrode, an insulator layer and an organic semiconductor layer, with a current between a source and a drain being controlled upon application of a voltage to the gate electrode, wherein the organic semiconductor layer includes a compound represented by the following formula (5):

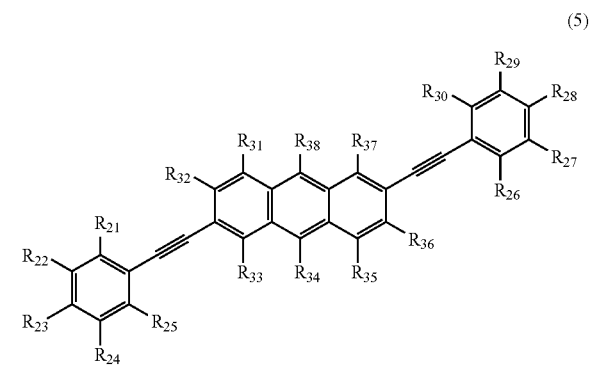

(5)

in the formula (5), R$_{21}$ to R$_{38}$ each independently represents a hydrogen atom, a halogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group; and each of these groups may have a substituent, and R$_{21}$ to R$_{25}$ and R$_{26}$ to R$_{30}$ may each form a saturated cyclic structure together with an adjacent group thereto.

20. The organic thin film transistor according to claim 19, wherein in the formula (5), R$_{21}$ to R$_{38}$ each independently represents a hydrogen atom, an alkyl group having from 1 to 30 carbon atoms, a haloalkyl group having from 1 to 30 carbon atoms, an alkoxyl group having from 1 to 30 carbon atoms, a haloalkoxyl group having from 1 to 30 carbon atoms, an alkylthio group having from 1 to 30 carbon atoms, a haloalkylthio group having from 1 to 30 carbon atoms, an alkylamino group having from 1 to 30 carbon atoms, a dialkylamino group having from 2 to 30 carbon atoms (the alkyl groups may be bonded to each other to form a nitrogen atom-containing cyclic structure), an alkylsulfonyl group having from 1 to 30 carbon atoms, a haloalkylsulfonyl group having from 1 to 30 carbon atoms, an aromatic hydrocarbon group having from 6 to 60 carbon atoms, an aromatic heterocyclic group having from 1 to 60 carbon atoms, an optionally substituted alkylsilyl group having from 1 to 30 carbon atoms or a cyano group; and each of these groups may have a substituent, and R$_{21}$ to R$_{25}$ and R$_{26}$ to R$_{30}$ may each form a saturated cyclic structure together with an adjacent group thereto.

* * * * *